(12) United States Patent
Chen et al.

(10) Patent No.: US 6,338,934 B1
(45) Date of Patent: Jan. 15, 2002

(54) HYBRID RESIST BASED ON PHOTO ACID/PHOTO BASE BLENDING

(75) Inventors: Kuang-Jung R. Chen, Poughkeepsie, NY (US); Mark C. Hakey; Steven J. Holmes, both of Milton, VT (US); Wu-Song Huang, Poughkeepsie, NY (US); Paul A. Rabidoux, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/383,452

(22) Filed: Aug. 26, 1999

(51) Int. Cl.$^7$ ............................................... G03F 7/004
(52) U.S. Cl. ..................... 430/270.1; 430/914; 430/919
(58) Field of Search ............................. 430/270.1, 914, 430/919

(56) References Cited

U.S. PATENT DOCUMENTS

| | | | |
|---|---|---|---|
| 5,545,509 A | 8/1996 | Cameron et al. | 430/270.1 |
| 5,585,220 A | 12/1996 | Breyta et al. | 430/270.1 |
| 5,595,855 A | 1/1997 | Padmanaban et al. | 430/270.1 |
| 5,595,856 A | 1/1997 | Mochizuki et al. | 430/270.1 |
| 5,609,989 A | 3/1997 | Bantu et al. | 430/270.1 |
| 5,627,010 A | 5/1997 | Pai et al. | 430/270.1 |
| 5,629,134 A * | 5/1997 | Oikawa et al. | 430/270.1 |
| 5,650,261 A | 7/1997 | Winkle | 430/270.1 |
| 5,667,938 A | 9/1997 | Bantu et al. | 430/270.1 |
| 5,683,856 A | 11/1997 | Aoai et al. | 430/270.1 |
| 5,691,100 A * | 11/1997 | Kudo et al. | 430/170 |
| 5,712,078 A | 1/1998 | Huang et al. | 430/270.1 |
| 5,733,705 A | 3/1998 | Bantu et al. | 430/270.1 |
| 5,776,660 A | 7/1998 | Hakey et al. | 430/296 |

OTHER PUBLICATIONS

Derwent WPI Abstract of EP Patent No. 599571 A3, Aug. 3, 1994.

James F. Cameron and Jean M.J. Frechet, "Photogeneration of Organic bases from o–Nitrobenzyl–Derived Carbamates", J. Am. Chem., Soc., 1991, 113, pp. 4303–4313.

* cited by examiner

Primary Examiner—Rosemary Ashton
(74) Attorney, Agent, or Firm—Schmeiser, Olsen & Watts; William D. Sabo

(57) ABSTRACT

A photo resist composition contains a polymer resin, a first photo acid generator (PAG) requiring a first dose of actinic energy to generate a first photo acid, and a photo base generator (PBG) requiring a second dose of actinic energy, different from the first dose, to generate a photo base. The amounts and types of components in the photo resist are selected to produce a hybrid resist image. Either the first photo acid or photo base acts as a catalyst for a chemical transformation in the resist to induce a solubility change. The other compound is formulated in material type and loading in the resist such that it acts as a quenching agent. The catalyst is formed at low doses to induce the solubility change and the quenching agent is formed at higher doses to counterbalance the presence of the catalyst. Accordingly, the same frequency doubling effect of conventional hybrid resist compositions may be obtained, however, either a line or a space may be formed at the edge of an aerial image. Feature size may also be influenced by incorporating a quenching agent into the resist composition that does not require photo generation.

29 Claims, 16 Drawing Sheets

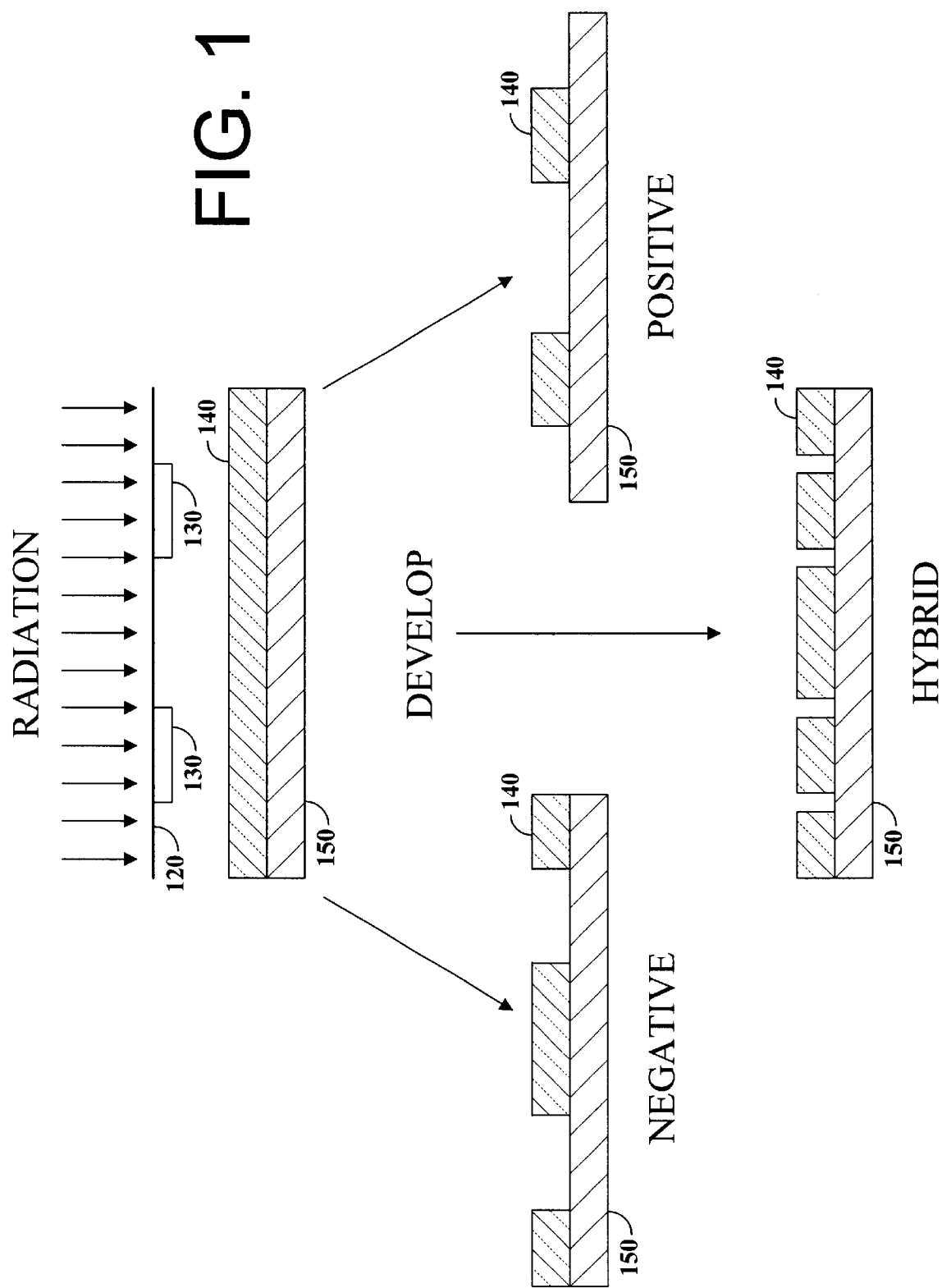

HYBRID RESIST BASED ON PHOTO ACID/PHOTO BASE BLENDING

RELATED APPLICATION

This application is related to the following U.S. patent applications: "FREQUENCY DOUBLING HYBRID PHOTO RESIST HAVING NEGATIVE AND POSITIVE TONE COMPONENTS AND METHOD OF PREPARING THE SAME," Ser. No. 08/715,287, filed Sep. 16, 1996, U.S. Pat. No. 6,114,082; "METHOD FOR FORMING FEATURES USING FREQUENCY DOUBLING HYBRID RESIST AND DEVICE FORMED THEREBY," Ser. No. 08/959,779, filed Oct. 29, 1997, U.S. Pat. No. 6,007,968; "OPTIMIZATION OF SPACE WIDTH FOR HYBRID PHOTO RESIST," Ser. No. 09/170,756, filed Oct. 13, 1998, U.S. Pat. No. 6,200,726; and "NOVEL METHOD FOR VARYING X-RAY HYBRID RESIST SPACE DIMENSION," Ser. No. 09/082,886, filed May 21, 1998, U.S. Pat. No. 6,014,422, each of which is incorporated herein by reference for their pertinent and supportive teachings.

BACKGROUND OF THE INVENTION

1. Technical Field

This invention relates generally to the field of semiconductor manufacturing and, more specifically, to photo resist compositions including both photo acid and photo base components that are adapted to produce a hybrid resist image.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced. For the past 20 years, optical lithography has driven the device density and the industry has resorted to optical enhancements to allow increasing densities. As an example, some such enhancements include over exposing/over developing, hard and soft phase shifts, phase edge masks, and edge shadowing. Unfortunately, such enhancements tend to offer only minor increases in density and the limits of optical enhancements appears inevitable in the near future. Further, in the scaling of lithography, the physical limits of some of the parameters previously relied upon to print smaller features are being approached. For optical lithography, wavelength and numerical aperture (NA) are reaching their limits at this time. New printing methods are needed to allow scaling of devices by other means than traditionally used. As described in the related applications incorporated by reference above, hybrid resists provide one means of accomplishing this goal, however, existing hybrid photo resist compositions also have limitations.

Conventional positive and negative tone photo resist used in optical lithography are characterized by a dissolution curve in which there is a single transition from a first dissolution rate to a second dissolution rate as the resist is exposed to increasing levels of actinic radiation. In a positive resist, the initially unexposed resist is practically insoluble in developer, while the exposed resist becomes more soluble as the exposure dose is increased above a threshold value. For a negative resist, similar behavior is observed, except that the initially unexposed resist is soluble in developer, and the exposed area is rendered practically insoluble. Because of this differential solubility between the exposed and unexposed resist areas, it is possible to form a pattern, or resist image, in the resist film. Essentially, the soluble areas of the resist dissolve in developer to become spaces in the resist, while the insoluble areas remain as lines of resist material. The resist image thus formed can be used to fabricate integrated circuit devices.

In an ideal situation, an exposure tool would only allow actinic energy to expose the resist material through a reticle of a mask, thus providing sharp edges for lines and spaces in a resist image. However, diffraction patterns are formed at the edges of the reticle, resulting in partial exposure of the resist about the edges of the a reticle. The partial exposure yields a resist profile that exhibits some slope at the transition from a line to a space rather than a sharp, vertical profile at the edge of a line, as would be present in an ideal resist image. A hybrid resist takes advantage of the slope in the exposure profile to produce a frequency doubled resist image. That is, where a positive resist will produce a space as a resist image, a hybrid resist will produce a space/line/space as a resist image in the same area. Thus, the number of features produced in the resist image are doubled in frequency.

Current formulations of hybrid resist use a balancing of cross-linking and solubility inhibition to express both positive and negative tone chemistry in the image formation process. This type of formulation allows a sub-lithographic space to be printed at the edges of the aerial image produced when radiation passes through the reticle of a mask. The more highly exposed center of the aerial image yields a line in the resist image, thus, the space/line/space effect is obtained. Current formulations, however, are not capable of printing a sub-lithographic line at the edges of the aerial image. It is desirable to print a sub-lithographic line as some applications for a hybrid resist in the production of semiconductors require a line pattern instead of a space pattern. Hybrid resist formulations that do not rely on the cross-linking mechanism are also desirable since the cross-linking mechanism is not currently available for some types of actinic radiation, such as 193 nanometer (nm) radiation.

Also, current formulations of hybrid resist possesses the advantage that the width of the sub-lithographic space is generally unchanging as the exposure dose and the reticle dimension are changed. This allows very precise image control for the space width within each chip, across each wafer, and from one batch of product wafers to the next. Nevertheless, the result of this advantage is that it can be difficult to alter the width of a sub-lithographic space in a hybrid resist image. In a conventional resist, altering the reticle dimension or exposure dose are the techniques commonly used to alter the resist image dimensions.

In keeping with the above discussion, it is apparent that current hybrid resist formulations possess the advantage of printing smaller features than presently possible through the scaling of lithography, due to the limits of wavelength and NA. For example, a 0.5 micrometer reticle opening could produce two 0.2 micrometer spaces and a 0.2 micrometer line. Despite this accomplishment, it is still desirable to reduce the size of features that may be produced using hybrid resist to further the continual increase of device density in semiconductor manufacturing.

Accordingly, it would be an improvement in the art to provide a photo resist composition that produces a hybrid resist image, yet will print a line and does not rely on a cross-linking mechanism. Also, it would be an improvement for such a composition to enable altering the width of features in a hybrid resist image. Further, it would be an improvement to produce smaller features than possible with current hybrid resist formulations.

DISCLOSURE OF INVENTION

According to the present invention, a photo resist composition is provided including a polymer resin, a first photo catalyst generator requiring a first dose of actinic energy to generate a first catalyst capable of inducing a solubility change in the polymer resin, and a photo quenching agent generator requiring a second dose of actinic energy greater than the first dose to generate a quenching agent. When the such a photo resist receives a single exposure of actinic energy, the first photo catalyst induces a solubility change in areas of the photo resist exposed to the first dose, while the photo generated quenching agent prevents a solubility change in areas of the photo resist exposed to the second dose. As a result, the photo resist exhibits a dissolution curve having a plurality of phases. That is, at least two solubility changes may be induced in the photo resist. A first solubility transition occurs at a low dose and a second solubility transition occurs at a higher dose. A photo resist exhibiting such a dissolution curve will produce a hybrid resist image upon development that includes at least one line and at least one space within an exposed region of the photo resist as the result of a single exposure to actinic energy. Depending on the formulation, either a space or a line may be printed at the edge of an aerial image produced by an exposure where diffraction effects reduce exposure dose at the image edge.

If a second photo catalyst generator is included requiring a third dose of actinic energy, greater than the second dose, to generate a second catalyst capable of inducing a solubility change, then it may overcome the quenching agent and produce a third solubility change, yielding a tri-phase dissolution curve. That is, a third solubility transition may occur after the second solubility transition at a dose beyond the higher dose. A photo resist exhibiting such a dissolution curve will produce a hybrid resist image upon development that includes either a space/line/space/line/space combination or a line/space/line/space/line combination within a single exposed region. Thus, an increased number of features, as well as potentially smaller features, may be produced compared to conventional hybrid resist formulations.

Further, a quenching agent additive may be included in the photo resist composition that shifts the first solubility transition of the dissolution curve caused by the first catalyst toward a second solubility transition of the dissolution curve caused by the photo generated quenching agent. A photo resist exhibiting such a change in the dissolution curve will produce a space or a line in the resist that is reduced in width compared to a corresponding space or line created without the quenching agent additive. Thus, altering the width of features, potentially sub-lithographic features, in a hybrid resist is enabled.

By way of example, the first and second catalyst may be an acid or a base and the quenching agent may respectively be a base or an acid.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and:

FIG. 1 is a schematic diagram showing the use of hybrid resist;

MODE(S) FOR CARRYING OUT THE INVENTION

Figure 3:
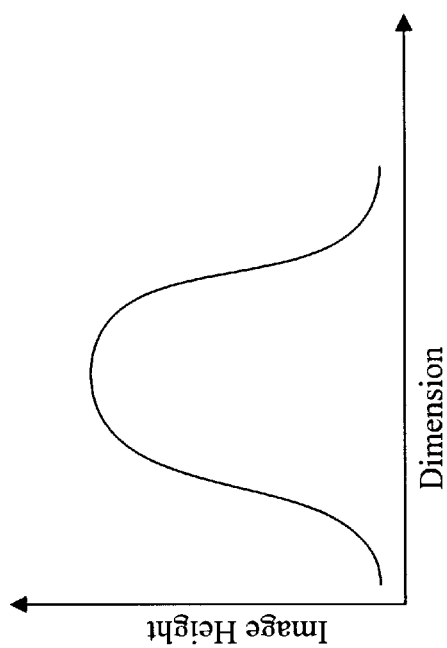
FIG. 3 is a graph illustrating the line pattern for positive resist printed with a reticle line pattern.

According to a preferred embodiment of the present invention, a photo resist composition is provided containing a polymer resin, a first photo acid generator (PAG) requiring a first dose of actinic energy to generate a photo acid, and a photo base generator (PBG) requiring a second dose of actinic energy, different from the first dose, to generate a photo base. The amounts and types of components in the photo resist are selected to produce a hybrid resist image, including at least one line and at least one space, within an exposed region of the photo resist as the result of a single exposure to actinic energy. Either the photo acid or photo base acts as a catalyst for a chemical transformation in the resist to induce a solubility change. The solubility change is either positive, rendering an initially insoluble resist soluble in developer, or negative, rendering an initially soluble resist insoluble in developer. The other compound is formulated in material type and loading in the resist such that it acts as a quenching agent. The catalyst is formed at low doses to induce the solubility change and the quenching agent is formed at higher doses to counterbalance the presence of the catalyst. At the edge of an aerial image, where diffraction effects reduce exposure level, the catalyst will activate a solubility change. In other regions of an aerial image, where exposure dose is higher, the quenching agent will counterbalance the catalyst to prevent a solubility change. Thus, if the photo resist composition is initially insoluble in developer and a positive solubility change is catalyzed, then a space/line/space combination may be printed in the exposed area. If the photo resist composition is initially soluble in developer and a negative solubility change is catalyzed, then a line/space/line combination may be printed in the exposed area. Accordingly, the same frequency doubling effect of conventional hybrid resist compositions may be obtained, however, either a line or a space may be formed at the edge of an aerial image.

The width of the line or space printed at the edge of the aerial image will depend on the difference between the exposure sensitivities of the PAG and PBG. However, feature size may also be influenced by incorporating a quenching agent into the resist composition that does not require photo generation. For example, a base may be included to reduce the space or line width printed at the edge of the aerial image. Further, a second photo activated catalyst generator may be included in the composition, requiring a third dose of actinic energy different from the first dose and second dose, such that the second photo catalyst may overcome the counterbalancing effect of the quenching agent. As a result, an additional feature may be printed at the center of the aerial image where exposure is at its maximum, producing a frequency tripling effect. Essentially, if a line is printed at the aerial image edge, then a line may also be printed at the aerial image center, and if a space is printed at the edge, then a space may also be printed at the center.

Hybrid Photo Resist

The preferred embodiments of the present invention relate to formulations and photo lithographic mechanisms for photo resist material adapted to producing a hybrid resist image or frequency multiplication (e.g., frequency doubling, tripling, etc.). Conventional hybrid photo resists and their several uses are described in the related applications listed above and incorporated herein by reference. A discussion of conventional hybrid photo resists is presented below along with a comparison to the compositions of the present invention.

As a conventional hybrid resist is exposed with actinic radiation, areas exposed with high intensity radiation form a negative tone line pattern. That is, the negative tone response predominates, causing a reduction in solubility in the more highly exposed areas, much as a conventional negative resist. Areas which are unexposed remain insoluble in developer, thus forming a positive tone line pattern. That is, a conventional hybrid resist is initially insoluble in developer, thus unexposed areas do not experience a change in solubility, much as a conventional positive resist. Areas which are exposed with intermediate amounts of intensity, such as the edges of the aerial image where diffraction effects have reduced the intensity, form a space in the resist film during develop. This resist response is an expression of the unique dissolution rate properties of conventional hybrid resist, in which unexposed resist does not development, partially exposed resist develops at a high rate, and highly exposed resist does not develop.

The unique dissolution rate response of the conventional hybrid resist allows a single aerial image to be printed as a space/line/space combination rather than as a single line or space as with a conventional resist. This may be termed "frequency doubling" and allows a conventional expose systems to be extended to higher pattern densities. For example, it is possible that aligns and spaces of 0.2 micrometer and less can be printed with current deep ultraviolet (DUV) lithography tools that are designed for operation at a maximum resolution of 0.35 micrometer.

Also, a conventional hybrid resist possesses the advantage that space width is generally unchanging as the exposure dose and reticle image size are changed. As exposure dose varies in an exposure process, space width is generally unaffected because the space develops in the conventional hybrid resist in areas of intermediate exposure at the edge of an aerial image. For the same reason, space width is also generally unaffected by variation in a reticle image size. These two advantages allow very precise image control for the space width in each chip, across each wafer, and from one batch of product wafers to the next. Errors in the image dimension of the reticle are not reproduced in the space width printed on the substrate.

Still another advantage of conventional hybrid resist is the relaxation of the minimum reticle feature size due to the frequency doubling capability of such a resist. For example, to print a 0.2 micrometer feature with a conventional resist generally requires a 0.2 micrometer reticle image size. With a hybrid resist, a 0.2 micrometer space can be formed with a single edge of a reticle feature. For example, a 0.5 micrometer reticle opening could produce to 0.2 micrometer spaces and the 0.2 micrometer line. In this way, one could accomplish "reduction" x-ray or E-beam lithography since the reticle image pitch could be approximately 2× the printed pitch on the substrate. Further, lines and spaces of 0.2 micrometer and less may be achieved without altering present optical lithography tools.

Turning to FIG. 1, an illustration of differences between a positive resist, a negative resist, and a hybrid resist is provided. In FIG. 1, a photo resist 140 has been formed over into the service of substrate 150. A mask 120 with chrome areas 130 is used to selectively mask portions of photo resist 140 from an optical radiation source. After exposure, photo resist 140 is developed and portions subsequently removed by washing the surface of the wafer. Depending on the nature and composition of photo resist 140 a certain pattern, which is related to chrome areas 130 on mask 120, may be formed in photo resist 140. As shown in FIG. 1, a positive photo resist may leave areas of resist in place that correspond to chrome areas 130. A negative photo resist may create a pattern whereby the areas that correspond to chrome areas 130 are removed from substrate 150. A hybrid photo resist material may leave a photo resist pattern that corresponds to removal of the photo resist material from the areas of substrate 150 that are associated with the edges of chrome areas 130.

Figure 2:
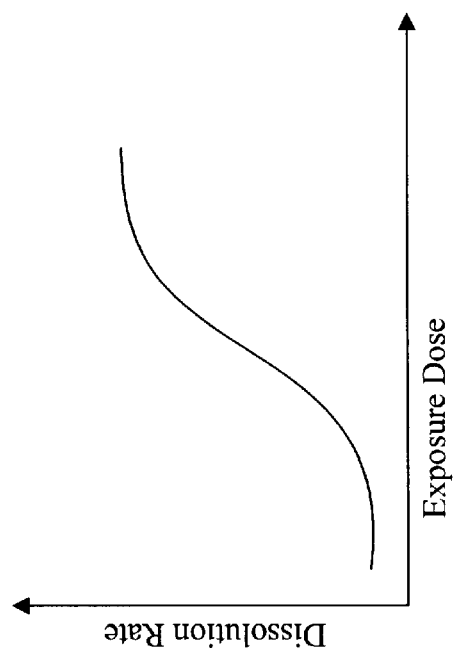
FIG. 2 is a graph is illustrating how positive resist undergoes an increase in solubility as the exposure dose is increased.
Figure 5:
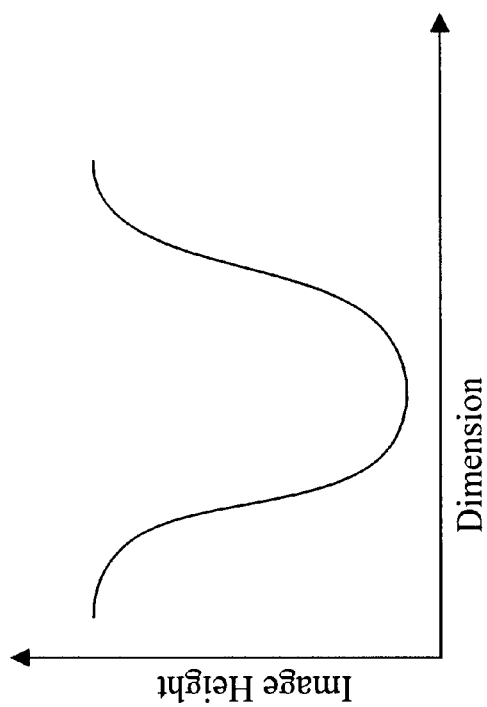
FIG. 5 is a graph illustrating the line pattern for negative resist printed with a reticle line pattern.
Figure 4:
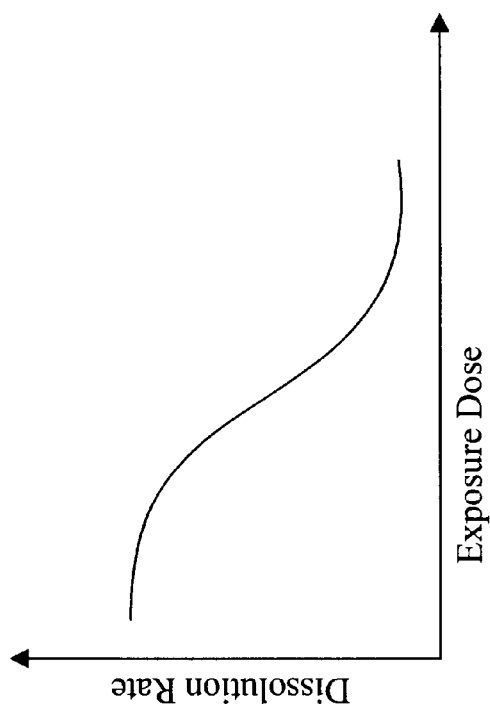
FIG. 4 is a graph illustrating how negative resist undergoes a reduction in solubility as the exposure dose is increased.

Turning to FIG. 2, a graph is provided illustrating how positive resist undergoes an increase in dissolution rate (solubility) as the exposure dose is increased. In FIG. 3, a graph is provided illustrating how image height of a positive resist increases then falls across a dimension equivalent to an aerial image. In other words, FIG. 3 describes the profile of a line pattern for positive resist printed with a reticle line pattern. Turning to FIG. 4, a graph is provided illustrating how negative resist undergoes a decrease in dissolution rate (solubility) as the exposure dose is increased. In FIG. 5, a graph is provided illustrating how image height of a negative resist decreases then rises across a dimension equivalent to an aerial image. In other words, FIG. 5 describes the profile of a line pattern for negative resist printed with a reticle line pattern.

Figure 7:
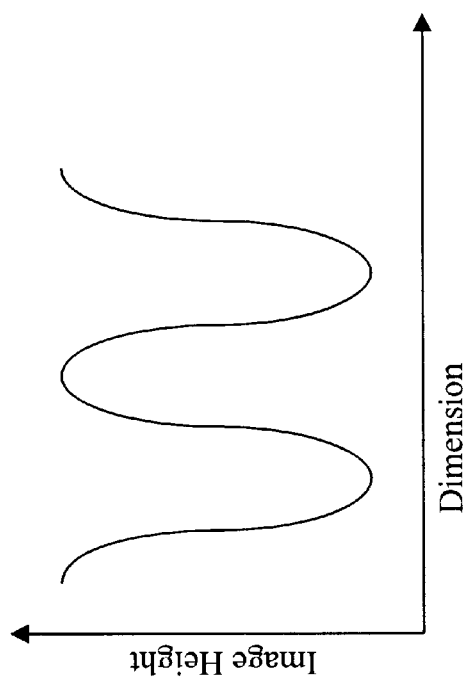
FIG. 7 is a graph illustrating the space/line/space pattern formed onto a substrate using hybrid resist.
Figure 6:
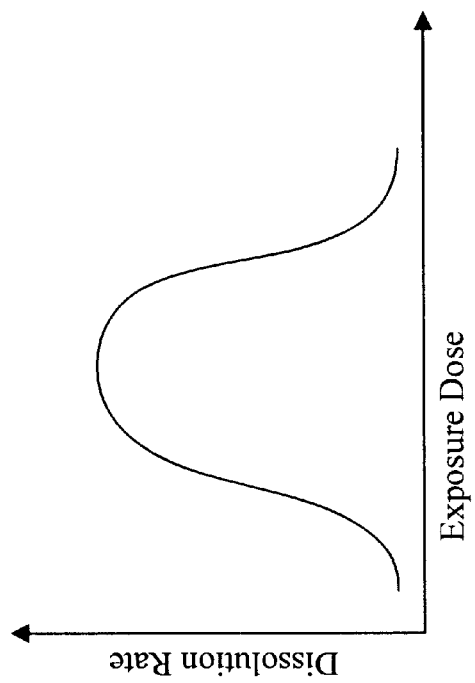
FIG. 6 is a graph of the resist solubility as a function of exposure dose for hybrid resist.

In a conventional hybrid resist, the photo resist material has a simultaneous positive tone and negative tone response to exposure. The positive tone response dominates at the lower exposure doses, while the negative response predominates at the higher exposure dosages. Exposure of a conventional hybrid resist thus creates a space/line/space combination, whereas either of the conventional positive or negative resists would produce only a single feature. In a conventional hybrid resist, the positive tone response causes an increase in solubility in the areas where diffraction effects have reduced the exposure intensity, such as the areas near the edge of the reticle image. As the exposure dose increases toward the center of the aerial image, the negative tone response increases in predominance, causing a reduction in solubility in the more highly exposed areas. Turning to FIG. 6, a graph is provided illustrating how conventional hybrid resist undergoes an increase in a dissolution rate as the exposure dose is increased followed by a decrease in dissolution rate as exposure dose increases further. In FIG. 7, a graph is provided illustrating how image height of a conventional hybrid resist decreases then rises then decreases again and rises again across a dimension equivalent to an aerial image. In other words, FIG. 7 describes the space/line/space profile of a line pattern for a conventional hybrid resist printed with a reticle line pattern. Still other characteristics of conventional hybrid resist are described in more detail in the applications incorporated herein by reference.

Preferred Embodiments

It is an advantage of the preferred embodiments of the present invention that a photo resist composition is provided that produces a hybrid resist image, yet will print a line in addition to a space, and does not rely solely on a cross-linking mechanism. Further, the preferred embodiments provide a composition that enables altering the width of features, potentially sub-lithographic features, in a hybrid resist image, as well as potentially producing smaller features, compared to current hybrid resist formulations. The preferred embodiments also provide frequency multiplication of features beyond frequency doubling.

In a preferred photo resist composition, a first PAG is provided that requires a first dose of actinic energy to create a photo acid and a PBG is provided that requires a second dose of actinic energy different from the first dose to generate a photo base. More preferably, the first PAG is used to create acid at low expose doses. The photo acid catalyzes a chemical transformation in the resist to induce a solubility change, either positively (to make the exposed area dissolve) or negatively (to make the exposed area insoluble to developer). Since the PBG requires a different dose of actinic energy, the photo base is more preferably formulated in material type and loading in the resist such that it is activated at higher expose doses than the PAG. As a result, the acid is formed at low doses to create a pattern, but at higher doses becomes quenched by the counterbalancing presence of the photo activated base. The result is that photo acid may be generated in all areas exposed to the low dose, but may be quenched in all areas exposed to the higher dose. Thus, a solubility change may only be induced in the areas exposed to the low dose, but not exposed to the higher dose, in other words, only in areas of intermediate exposure level. One area of intermediate exposure exists at the edge of an aerial image exposed through a reticle opening of a mask. If a polymer resin is included in the photo resist composition that experiences a solubility increase when exposed to acid, then a space will be formed in the photo resist at the edge of the aerial image after developing. If a polymer resin is included that instead cross links when exposed to acid, then a line may form at the edge of the aerial image after developing. As an alternative, it is also conceivable that the photo base may instead be formed at low doses to create a pattern and at higher doses becomes quenched by the counterbalancing presence of a photo activated acid.

Figure 8:
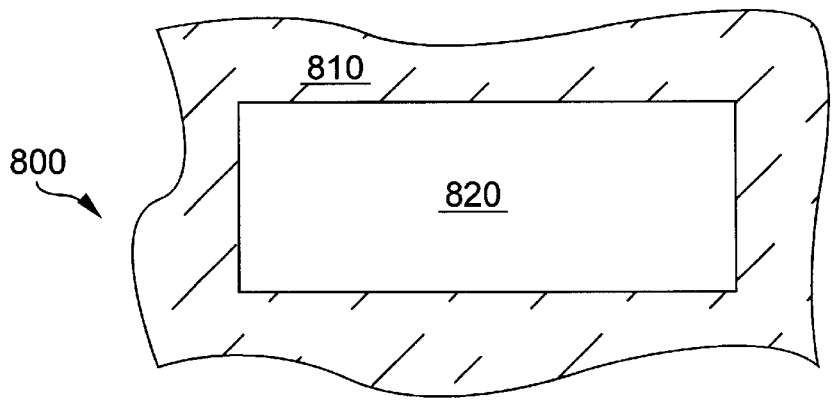
FIG. 8 is a schematic view of an exemplary mask portion.

Turning to FIG. 8, an exemplary mask portion 800 containing a mask blocking shape 810 and a reticle opening 820 is illustrated. When actinic radiation is applied through reticle opening 820 of mask portion 800, diffraction and other optical effects may occur about the edges of the reticle opening, producing a gradual transformation from no exposure in the region of blocking shape 810 to full exposure in the center region of reticle opening 820. As known to those skilled in the art, the resulting aerial image or exposure profile from exemplary mask portion 800 may possess areas of intermediate exposure levels about the edges of reticle opening 820. In the areas of intermediate exposure, exposure dose will be greater than zero exposure but less than full exposure. The various photo resist compositions according to the preferred embodiments take advantage of these areas of intermediate exposure to produce a hybrid resist image.

Figure 9:
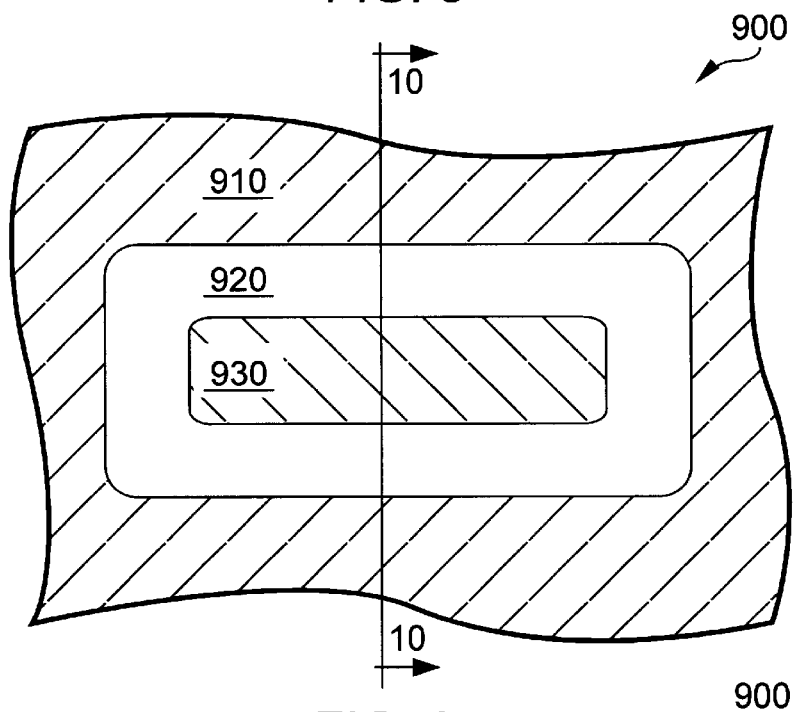
FIGS. 9, 11, 13, 15, 17, and 19 are top views of a wafer portion with patterned hybrid resist.
Figure 10:
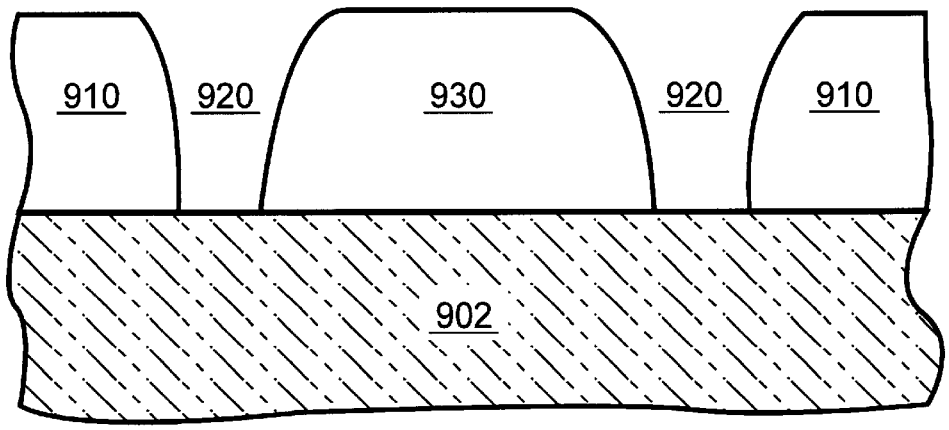
FIGS. 10, 12, 14, 16, 18, and 20 are cross-sectional side views of the wafer portions of FIGS. 9, 11, 13, 15, 17, and 19, respectively, taken along lines 10—10, 12—12, 14—14, 16—16, 18—18, and 20—20, respectively.

FIGS. 9 and 10 show a wafer portion 900 having hybrid resist deposited on a substrate 902, exposed through mask portion 800, and developed. The hybrid resist composition of wafer portion 900 is one in which the polymer resin experiences a solubility increase when exposed to acid, the PAG is activated at low doses to produce acid, and the PBG is activated at higher doses to produce base. Preferably, the difference between the low dose to activate the PAG and the higher dose to activate the PBG is greater than approximately 3 millijoules per square centimeter (mJ/cm$^2$). More preferably, the difference is greater than approximately 30 mJ/cm$^2$. Also, preferably the concentration of the PBG is greater than the concentration of the PAG. More preferably, the concentration of the PBG is approximately double the concentration of the PAG. It is conceivable that a different formulation within the scope of the present invention could produce the hybrid resist of wafer portion 900, although it is not preferred.

Using such a hybrid resist, unexposed portions under mask blocking shape 810 remain photo active and insoluble in developer and form a positive tone line 910. That is, just as a conventional positive resist is initially insoluble and remains insoluble in unexposed areas, unexposed portions of the hybrid resist of wafer portion 900 are initially insoluble and remain insoluble in developer. Intermediate exposed portions of the hybrid resist under the edges of reticle opening 820 become soluble in developer solution after the first exposure and are dissolved during development to form a space 920 in the hybrid resist. Fully exposed portions of the hybrid resist about the center of the aerial image formed by reticle opening 820 become photo inactive, but are also insoluble in developer, and form a line 930. In the portion of the hybrid resist forming line 930, the PAG was activated as was the PBG, thus, the photo base quenched the photo acid and solubility of the polymer resin was unchanged. In the portion of the hybrid resist forming space 920, the PAG was activated but exposure level was not high enough to activate the PBG thus, no counterbalancing of the photo acid occurred, solubility of the polymer resin was increased, and the resist developed away.

The frequency doubled, hybrid resist image shown in FIGS. 9 and 10 exhibits very similar characteristics to those described above for conventional hybrid resist. However, the composition according to a preferred embodiment that produces the resist image of wafer portion 900 is but one composition of several within the scope of the present invention. Line 930 of wafer portion 900 is similar to a negative tone line pattern formed in a conventional hybrid resist in that both are insoluble in developer. Nevertheless, the two lines are different in that line 930 is not cross-linked, but simply maintains the initial insolubility of the polymer resin. Neither lines are photo active. Line 910 of wafer portion 900 is similar to a positive tone line pattern formed in a conventional hybrid resist in that both remain photo active and insoluble in developer. Because line 910 was not exposed during a first exposure, it may later be blanket exposed at an intermediate exposure level and washed away during development. However, no such effect will occur in line 930 as a result of additional exposure to actinic radiation. Line 910 may also be blanket exposed at a full exposure level to become photo inactive.

As with conventional hybrid resist, the resist composition used to form wafer portion 900 possesses the advantage that space width is generally unchanging as the exposure dose and reticle image size are changed. Rather, space width is determined largely by the difference in the required exposure dose of the PAG and PBG. The smaller the difference, the more narrow may be space 920. The larger the difference, the more wide may be space 920. At any rate, the preferred hybrid resist formulation allows very precise image control for space width within each chip, across each wafer, and from one batch of product wafers to the next. Also, errors in the image dimension of reticle 820 are not reproduced in the space width printed in the resist. Further, even though a different resist composition is used and a different photo lithographic mechanism occurs, the same advantages additionally described above for conventional hybrid resist also exist for the compositions according to preferred embodiments of the present invention.

One example of a resist composition that may be used to form wafer portion 900 combines a polyhydroxystyrene methoxycyclohexene (PHOST MOCH) resin with approximately 1% by weight of solids di(p-t-butylphenyl)iodonium camphorsulfonate (tBIC) PAG and approximately 2% by weight of solids nitrocarbamate PBG. In this example, the weight % of PBG happens to be greater than the weight % of PAG, however, the key factor is that the quenching agent be present in an amount sufficient to overcome the catalyst. Accordingly, consideration should be given to the mole % of the components and the catalyst or quenching agent yield from the PAG or PBG. It is conceivable that the PBG could be present in a smaller mole % than the PAG if the comparable yields of photo base were enough to quench the respective yields of photo acid. In this example, the PHOST MOCH resin experiences an increase in solubility through cleaving of methoxycyclohexene side chains in a deprotection reaction when exposed to acid. A photo acid may be activated at about 9 $mJ/cm^2$, while a photo base may be activated at about 80 $mJ/cm^2$. Thus, image wise exposure of such a resist system at 100 $mJ/cm^2$ creates a space about 2.0 μm in width in the resist at the edge of each reticle feature.

Figure 21:
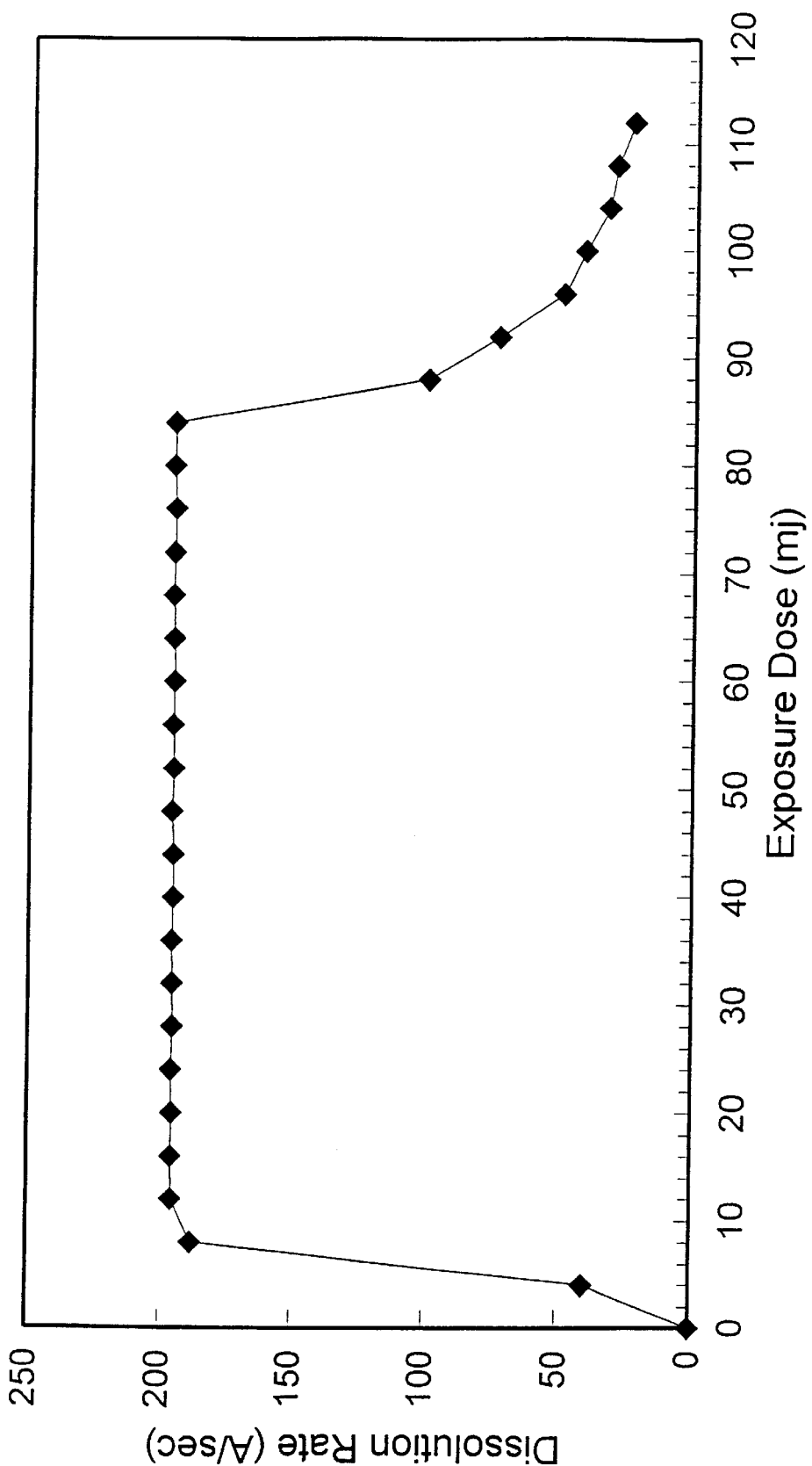
FIGS. 21–25 are dissolution rate response curves.
Figure 26:
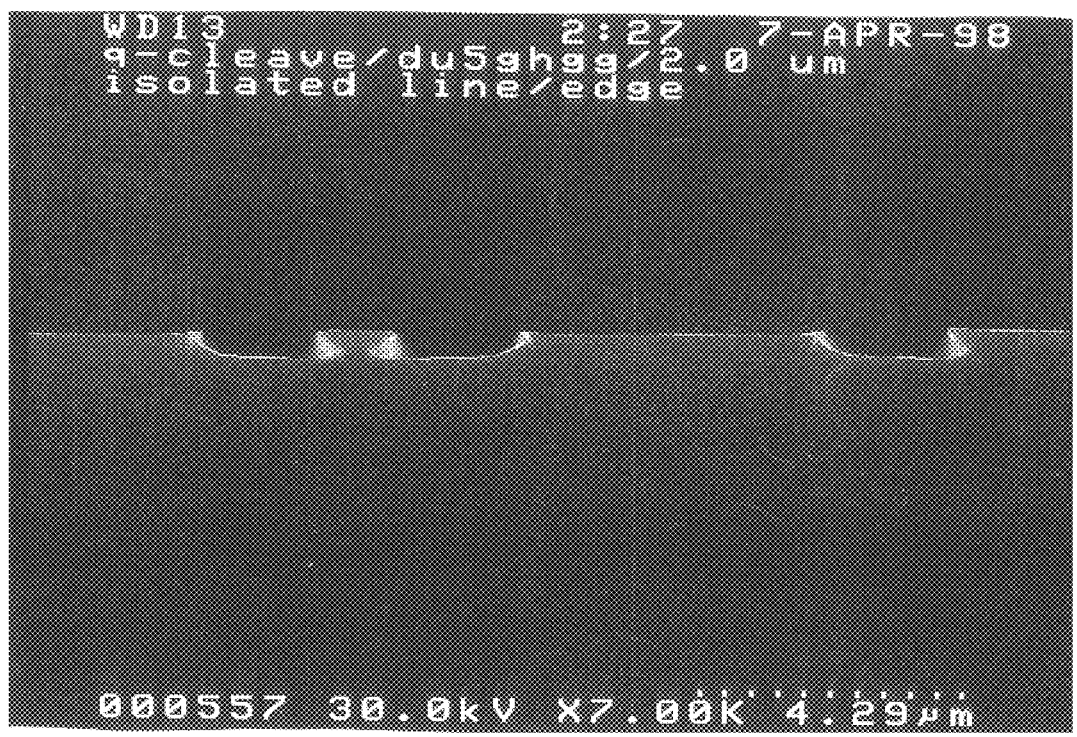
FIG. 26 is a photomicrograph of a cross-section from a resist layer.

The dissolution rate response curve for the same composition described immediately above is shown in FIG. 21. Notably, the dissolution rate decreases at less than about 9 $mJ/cm^2$ and greater than about 80 $mJ/cm^2$, but is higher at exposures between 9 and 80 $mJ/cm^2$. FIG. 26 is a photomicrograph from a scanning electron microscope showing an upward perspective view of a cross-section from a resist layer formed using the same composition. The reticle used to expose the resist layer in FIG. 26 included an opening through a chrome mask with isolated chrome lines of varying widths formed across the opening. The isolated space printed in the resist of FIG. 26 was formed at the edge of one side of the opening through the chrome mask. The space/line/space feature printed in the resist of FIG. 26 was formed beneath a 2.0 μm wide chrome line. Accordingly, the line in the space/line/space feature was an area of low or no exposure and the two spaces were areas of intermediate exposure at the edge of the chrome line. The isolated space was also an area of intermediate exposure, but at the edge of the opening through the chrome mask. The remaining areas of the resist in FIG. 26, wherein no spaces were formed, were areas of full exposure.

Figure 11:
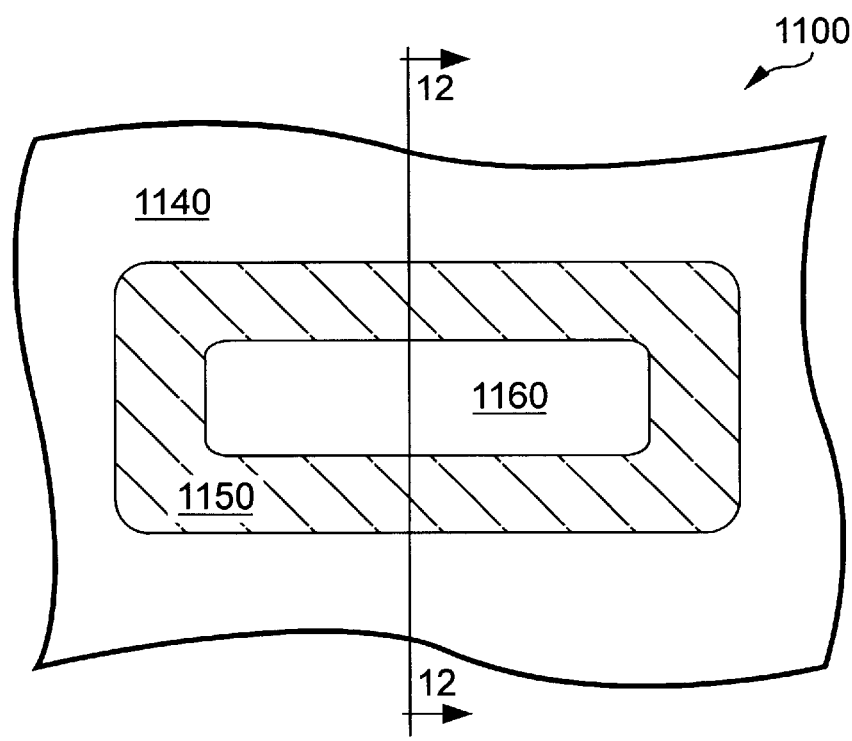
Figure 12:
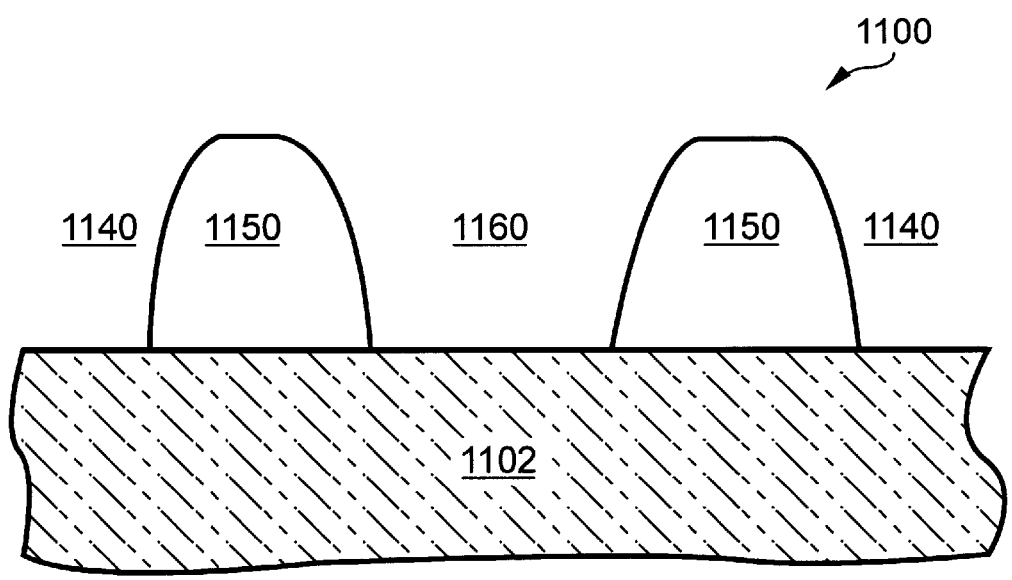

Turning to FIGS. 11 and 12, a wafer portion 1100 is shown having a hybrid resist deposited on a substrate 1102, exposed through a mask portion 800, and developed. The hybrid resist composition of wafer portion 1100 is one in which the polymer resin experiences a solubility decrease when exposed to acid, the PAG is activated at low doses to produce acid, and the PBG is activated at higher doses to produce base. More preferably, the difference between the low dose and higher dose and relative concentration of PAG and PBG is the same as described above for the hybrid resist of wafer portion 900. It is conceivable that a different formulation within the scope of the present invention could produce the hybrid resist of wafer portion 1100, although it is not preferred.

For wafer portion 1100, unexposed portions under mask blocking shape 810 become soluble in developer and form a negative tone space 1140. That is, just as a conventional negative resist is initially soluble and remains soluble in unexposed areas, unexposed portions of the hybrid resist of wafer portion 1100 are initially soluble and remain soluble in developer. Intermediate exposed portions of the hybrid resist under the edges of reticle opening 820 become insoluble in developer solution after the first exposure and remain after development to form a line 1150 of the hybrid resist. Fully exposed portions of the hybrid resist about the center of the aerial image formed by reticle opening 820 become photo inactive, but are also soluble in developer, and form a space 1160. In the portion of the hybrid resist forming space 1160, the PAG was activated as was the PBG, thus, the photo base quenched the photo acid and solubility of the polymer resin was unchanged. In the portion of the hybrid resist forming line 1150, the PAG was activated but exposure level was not high enough to activate the PBG thus, no counterbalancing of the photo acid occurred, solubility of the polymer resin was decreased, and the resist remained after development. The solubility decrease may be affected by cross-linking of the polymer resin or by other mechanisms known to those skilled in the art, such as cleaving of pendant side chains that would otherwise keep the polymer resin soluble in developer. Notably, the ability of a photo resist composition according to the preferred embodiments to form a line at the edge of an aerial image is a substantial improvement over conventional hybrid resists which can only form a space at the edge of an aerial image.

Figure 25:
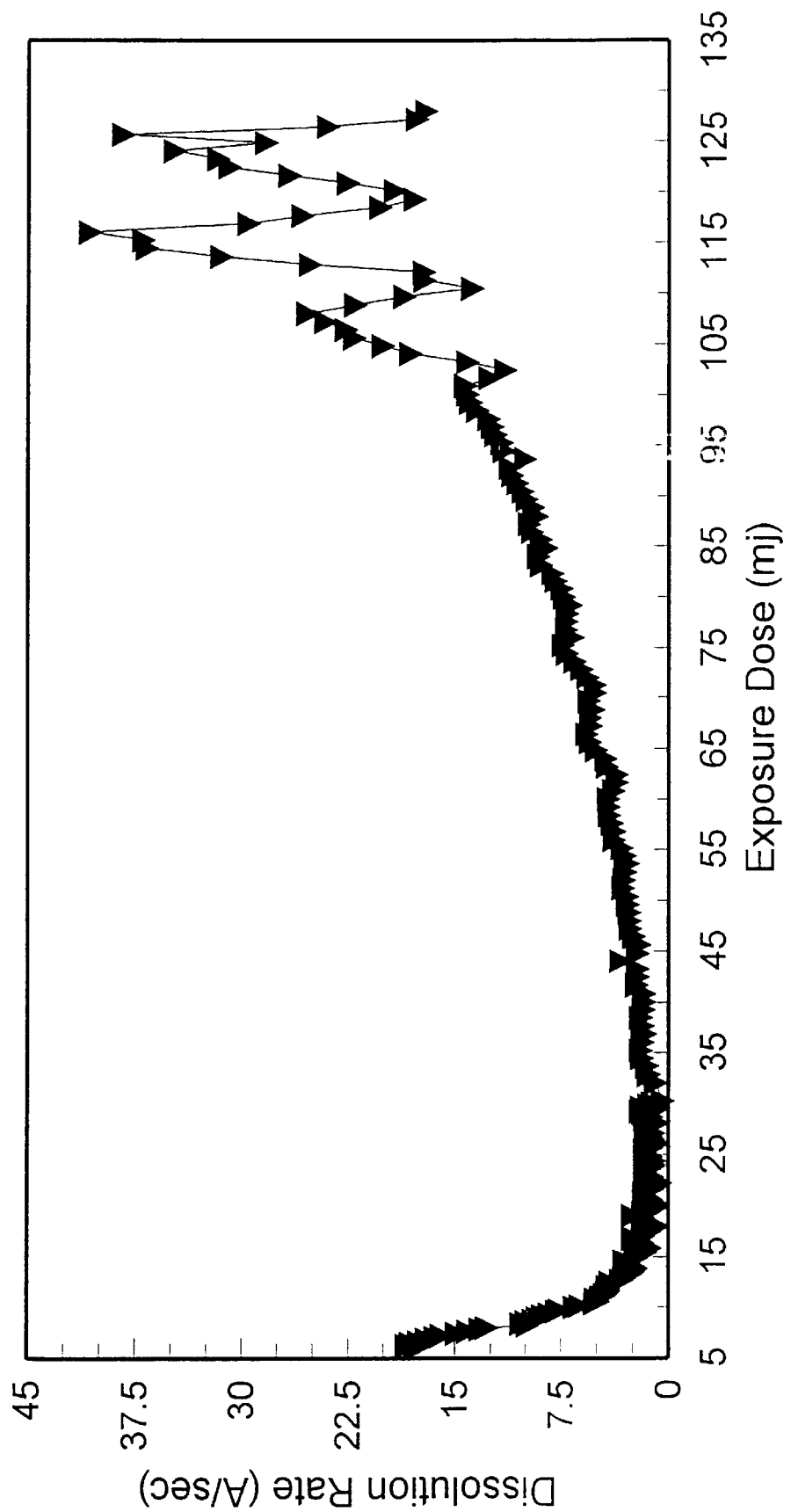

One example of a resist composition that may be used to form wafer portion 1100 combines a polyhydroxystyrene (PHOST) resin with approximately 1% by weight of solids triphenylsulfonium triflate (TPS) PAG, approximately 2% by weight of solids nitrocarbamate PBG, and a cross-linker. In this example, the PHOST resin experiences a decrease in solubility through cross-linking when exposed to acid. A photo acid may be activated at about 10 $mJ/cm^2$, while a photo base may be activated at about 110 $mJ/cm^2$. Thus, image wise exposure of such a resist system at greater than about 130 $mJ/cm^2$ may create a line in the resist at the edge of each reticle feature. The dissolution rate response curve for this material is shown in FIG. 25. Notably, the dissolution rate increases at less than about 10 $mJ/cm^2$ and greater than about 110 $mJ/cm^2$, but is lower at exposures between 10 and about 110 $mJ/cm^2$.

It is a further advantage over conventional hybrid resists that resist compositions according to preferred embodiments of the present invention may be formulated to alter the image size of the hybrid image. Such an advantage may be accomplished by providing a base additive at a suitable concentration, preferably in the range of about 0.05 to 0.2% by weight of solids, to the above PHOST MOCH or PHOST resin with approximately 1% by weight of solids tBIC or TPS PAG and approximately 2% by weight of solids nitrocarbamate PBG. Other PAG/PBG resist compositions may require a different composition range of base additive to provide alteration of the image size after consideration of photo acid/base yields from the generators and mole % of the photo acid/base. There are some PBGs known to produce two to three times the quantum yield of the nitrocarbamate PBG. Other PBGs may produce a lower quantum yield and require more base additive to achieve the desired effect. These slower PBGs, however, would be less useful since they would probably require a higher expose dose and lower throughput of the exposure tool. One acceptable base additive is tetrabutyl ammonium hydroxide (TBAH), although other base additives may also work.

When a hybrid resist is formulated by adding both a PAG and PBG to either a positive or negative tone resin, two transitions in the dissolution response curves can be generated in the film upon exposure to actinic radiation. For example, if a positive tone resin is used, then the PAG may create acid at low expose doses which induces deprotection and solubilization of the exposed area, causing a first transition in the dissolution rate of the resist. The PBG may create base at higher expose doses, quenching the photo acid and causing a second transition in the dissolution rate of the resist, such that highly exposed resist does not dissolve. The two transitions in a dissolution response curve are shown in FIG. 6 where dissolution rate at first increases with increasing exposure dose, but then decreases as exposure dose continues to increase. For a negative tone resin, the dissolution response curve of FIG. 6 would be inverted. That is, dissolution rate would begin high and decrease with increasing exposure dose, but then increase as exposure dose continues to increase.

For any hybrid resist, the hybrid space width or line width formed at the edge of the aerial image is determined primarily by the difference between the exposure dose where a first transition in the dissolution rate of the resist occurs and the exposure dose where a second transition in the dissolution rate occurs. If this difference is large, a large space or line width may print. If this difference is small, a small space width or line width may print. In PAG/PBG resist compositions according to the preferred embodiments, space or line width can be adjusted without changing the exposure dose at which the PAG generates acid or the exposure dose at which the PBG generates base. When the PAG generates acid at a low dose and the PBG generates base at a higher dose, adding a base additive, such as TBAH, to the formulation can shift the dissolution curve. Essentially, the portion of the dissolution curve created by the photo acid is shifted into closer proximity to that part of the dissolution curve created by the photo base, causing the space width or line width to narrow. By choosing an appropriate loading of base, a desired space or line width is printed in the final hybrid resist image. An analogous mechanism, though not preferred, is also conceivable when the PBG generates base at a low dose and the PAG generates acid at a higher dose, except that an acid additive would be provided. It may be difficult to formulate such a resist given that the acid additive could potentially reduce shelf life of the composition.

Figure 13:
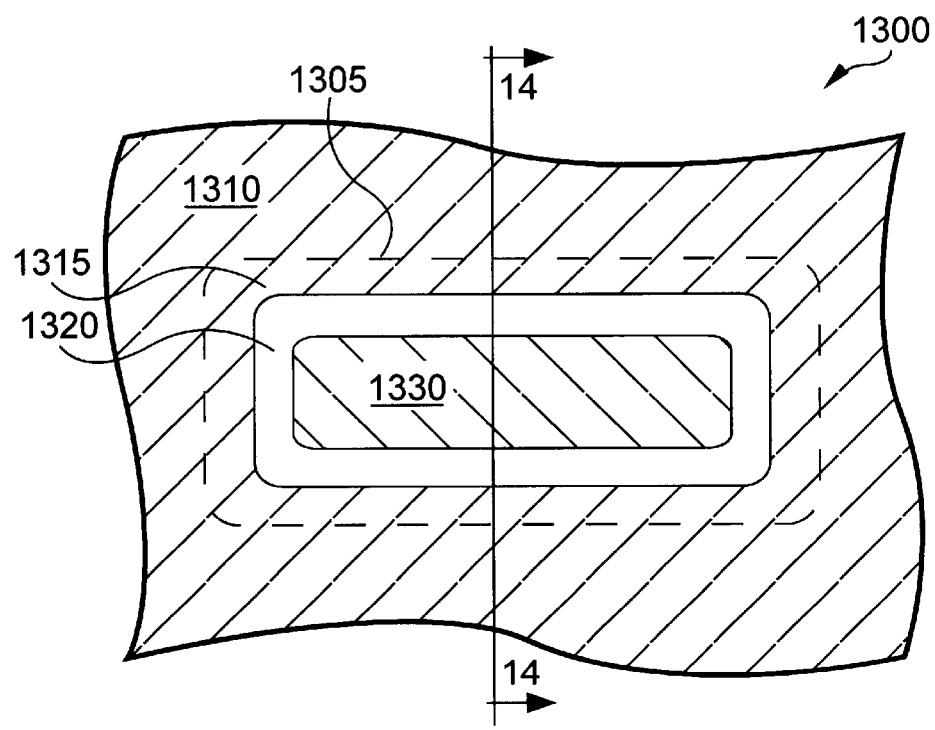
Figure 14:
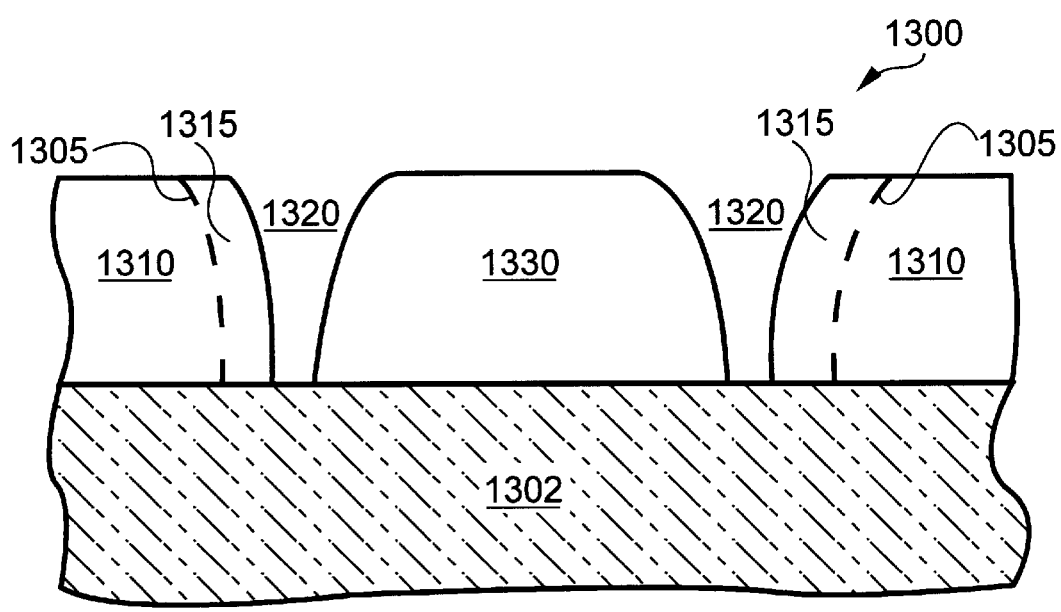

FIGS. 13 and 14 show a wafer portion 1300 having a hybrid resist deposited on substrate 1302, exposed through mask portion 800, and developed. The hybrid resist composition of wafer portion 1300 is one in which the polymer resin experiences a solubility increase when exposed to acid, the PAG is activated at low doses to produce acid, the PBG is activated at higher doses to produce base, and a base additive is provided. More preferably, the difference between the low dose and higher dose and relative concentration of PAG and PBG is the same as described above for the hybrid resist of wafer portion 900. It is conceivable that a different formulation within the scope of the present invention could produce the hybrid resist of wafer portion 1300, although it is not preferred.

Using such a hybrid resist, unexposed portions under mask blocking shape 810 remain photo active and insoluble in developer and form a positive tone line 1310. In addition, a line extension 1315 of line 1310 may also form as a result of providing a base additive and shifting the portion of the dissolution curve created by the photo acid toward the portion of the dissolution curve created by the photo base. Essentially, the small amount of base additive counterbalances the photo acid initially formed at the outside periphery of the aerial image. Once the amount of photo acid generated is sufficient to overcome the small amount of base additive, space 1320 in the hybrid resist may form as usual as an area of intermediate exposure under the edges of reticle opening 820 by becoming soluble in developer solution. Dashed line 1305 shows the dimension of space 1320 that would exist were it not for the presence of a base additive and defines the beginning of line extension 1315. Because photo acid has been generated in line extension 1315 and counterbalanced by base additive, line extension 1315 may not be photo active by comparison to line 1310 which remains photo active. As usual, fully exposed portions of the hybrid resist about the center of the aerial image formed by reticle opening 820 become photo inactive, but are also insoluble in developer, and form a line 1330. In the portion of the hybrid resist forming line 1330, the PAG was activated as was the PBG, thus, the photo base quenched the photo acid and solubility of the polymer resin was unchanged.

One example of a resist composition that may be used to form wafer portion 1300 combines PHOST MOCH resin with approximately 1% by weight of solids tBIC PAG, 2% nitrocarbamate PBG, and 0.1% TBAH as base additive. The PHOST MOCH resin experiences an increase in solubility through deprotection when exposed to acid. A photo acid may be activated at about 9 mJ/cm$^2$, while a photo base may be activated at about 80 mJ/cm$^2$. In addition, the TBAH may shift the portion of the dissolution curve caused by the photo acid, narrowing the space produced at the edge of the reticle opening. Thus, image wise exposure of such a resist system at 100 mJ/cm$^2$ creates a space in the resist nearly half the width of a comparable space created without the base additive.

Figure 22:
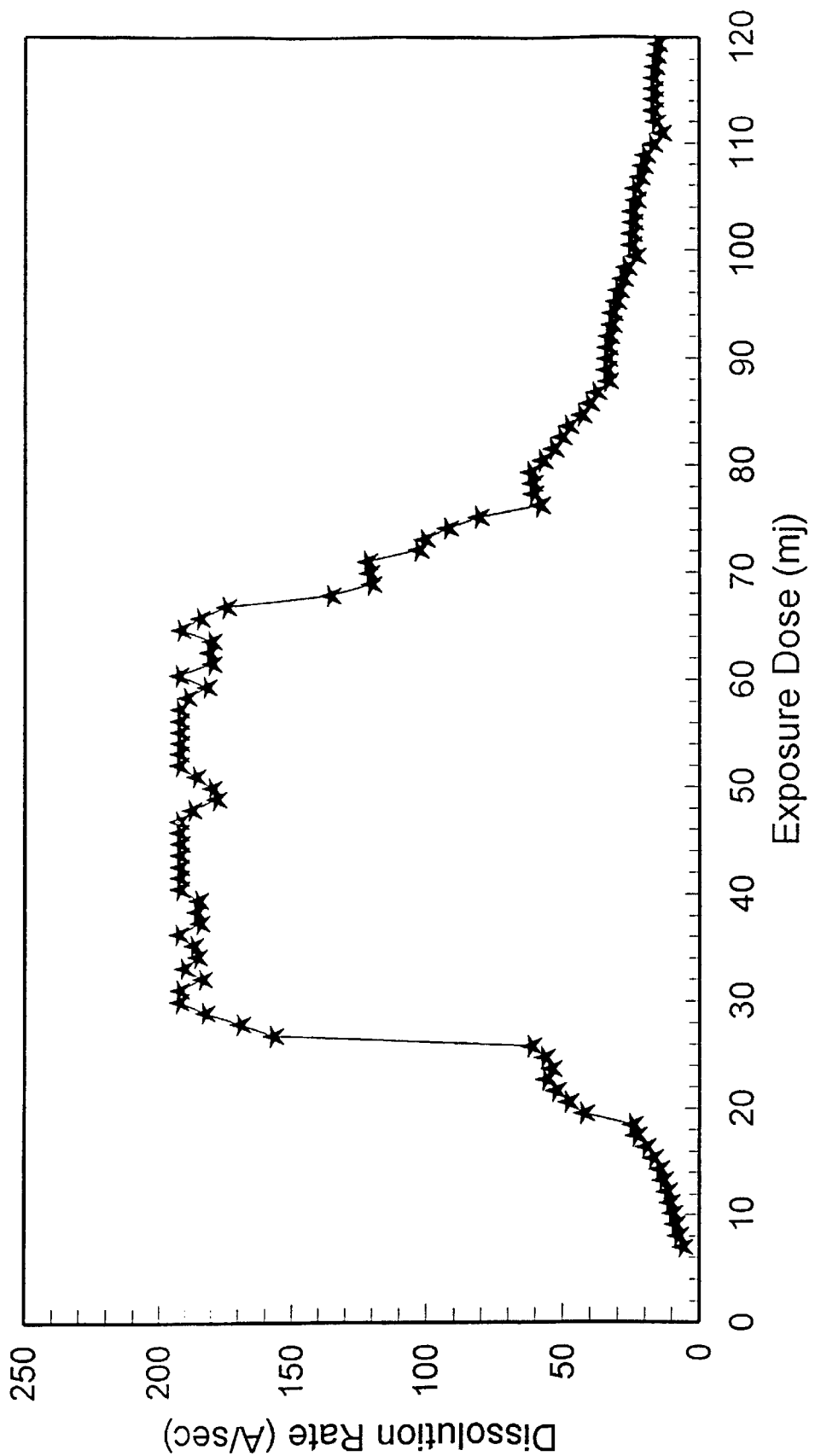
Figure 23:
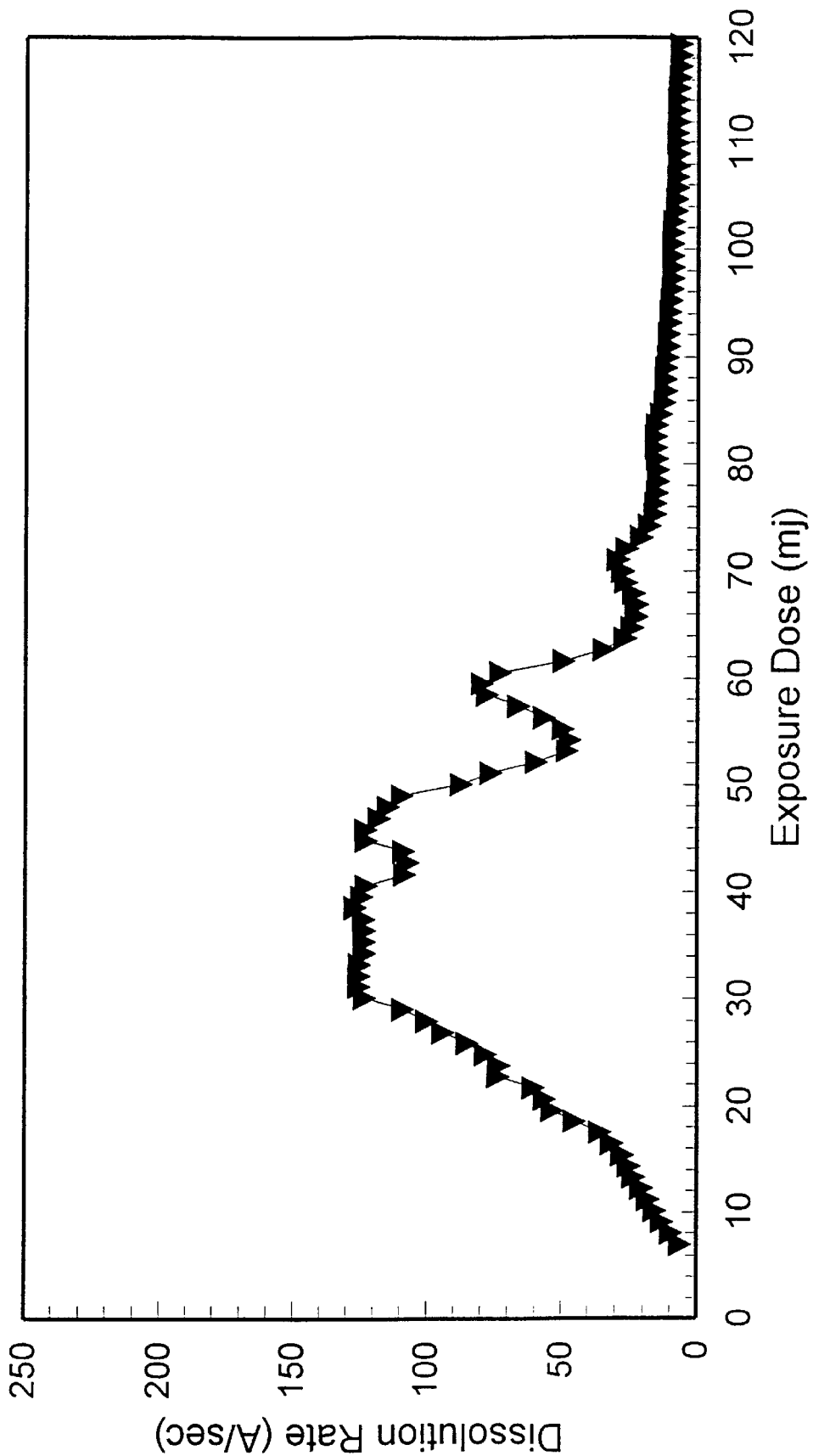

The dissolution rate response curve for the same composition described immediately above is shown in FIG. 22. Notably, the dissolution rate decreases at less than about 26 mJ/cm$^2$ and greater than about 68 mJ/cm$^2$, but is higher at exposures between 26 and 68 mJ/cm$^2$. Accordingly, the area of intermediate exposure that will produce a hybrid space is smaller than that shown in FIG. 21 for a resist without a base additive. FIG. 23 shows a response curve for the material of FIG. 22 with the amount of base additive increased to 0.13% TBAH. Notably, the area of intermediate exposure that will produce a hybrid space is further decreased by adding more base additive.

Figure 15:
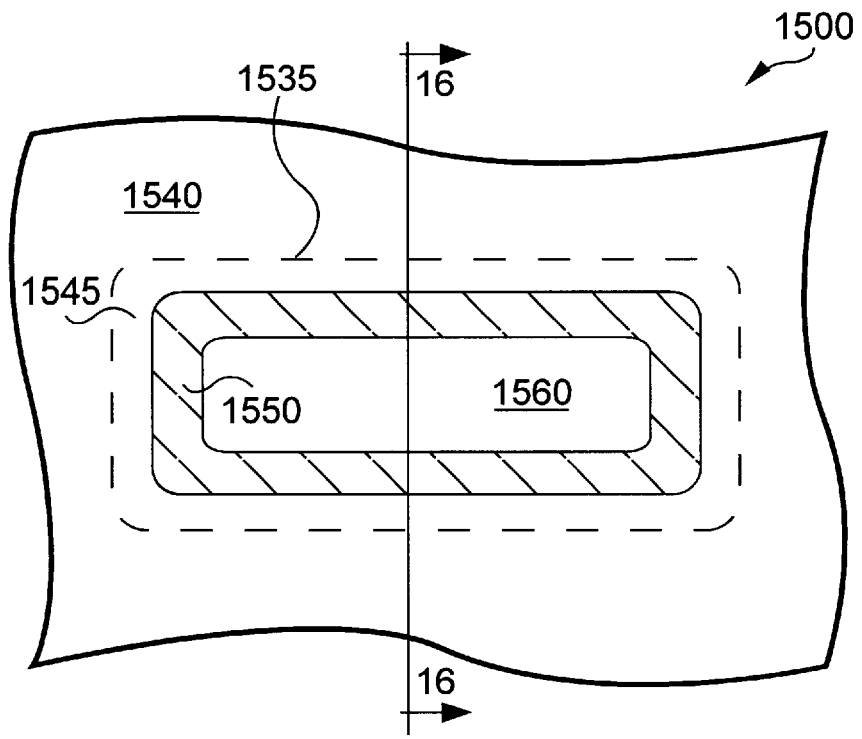
Figure 16:
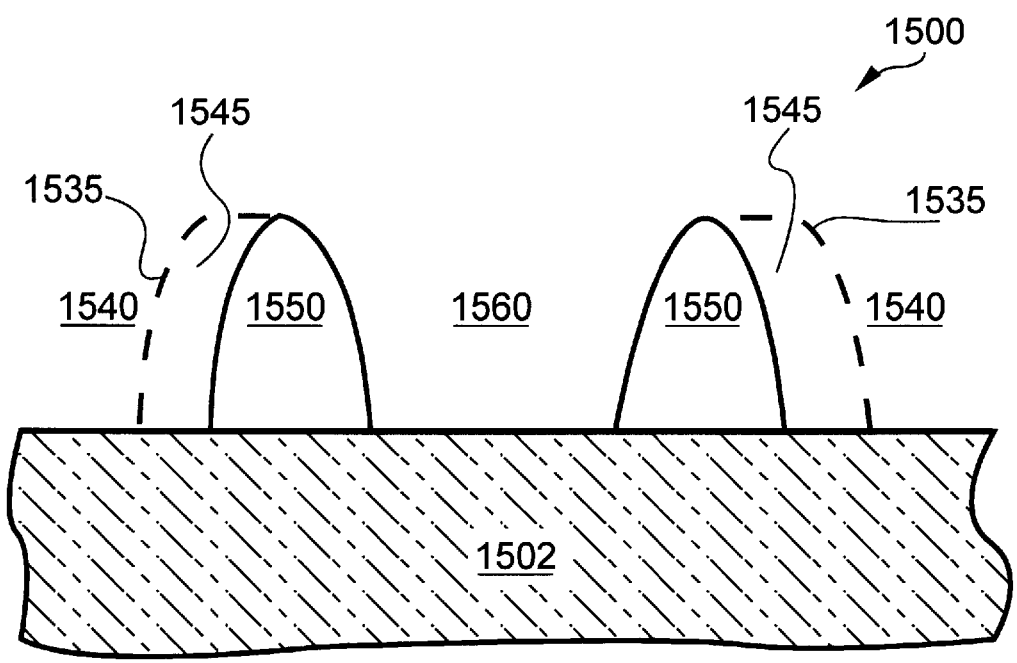

FIGS. 15 and 16 show a wafer portion 1500 having a hybrid resist deposited on substrate 1502, exposed through mask portion 800, and developed. The hybrid resist composition of wafer portion 1500 is one in which the polymer resin experiences a solubility decrease when exposed to acid, the PAG is activated at low doses to produce acid, the PBG is activated at higher doses to produce base, and a base additive is provided. More preferably, the difference between the low dose and higher dose and relative concentration of PAG and PBG is the same as described above for the hybrid resist of wafer portion 900. It is conceivable that a different formulation within the scope of the present invention could produce the hybrid resist of wafer portion 1500, although it is not preferred.

Using such a hybrid resist, unexposed portions under mask blocking shape 810 remain photo active and soluble in developer and form a negative tone space 1540. In addition, a space extension 1545 of space 1540 will also form as a result of providing a base additive and shifting the portion of the dissolution curve created by the photo acid toward the portion of the dissolution curve created by the photo base. Essentially, the small amount of base additive counterbalances the photo acid initially formed at the outside periphery of the aerial image. Once the amount of photo acid generated is sufficient to overcome the small amount of base additive, line 1550 may form as usual as an area of intermediate exposure under the edges of reticle opening 820 by becoming insoluble in developer solution. Dashed line 1535 shows the dimension of line 1550 that would exist were it not for the presence of a base additive and defines the beginning of space extension 1545 as usual, fully exposed portions of the hybrid resist about the center of the aerial image formed by reticle opening 820 become photo inactive, but are also soluble in developer, and form a space 1560. In the portion of the hybrid resist forming space 1560 the PAG was activated as was the PBG, thus, the photo base quenched the photo acid and solubility of the polymer resin was unchanged. As can be seen in FIGS. 15 and 16, image wise exposure of the resist on wafer portion 1500 creates a line in the resist that is reduced in width compared to the line created without the base additive shown in FIGS. 11 and 12.

Figure 24:
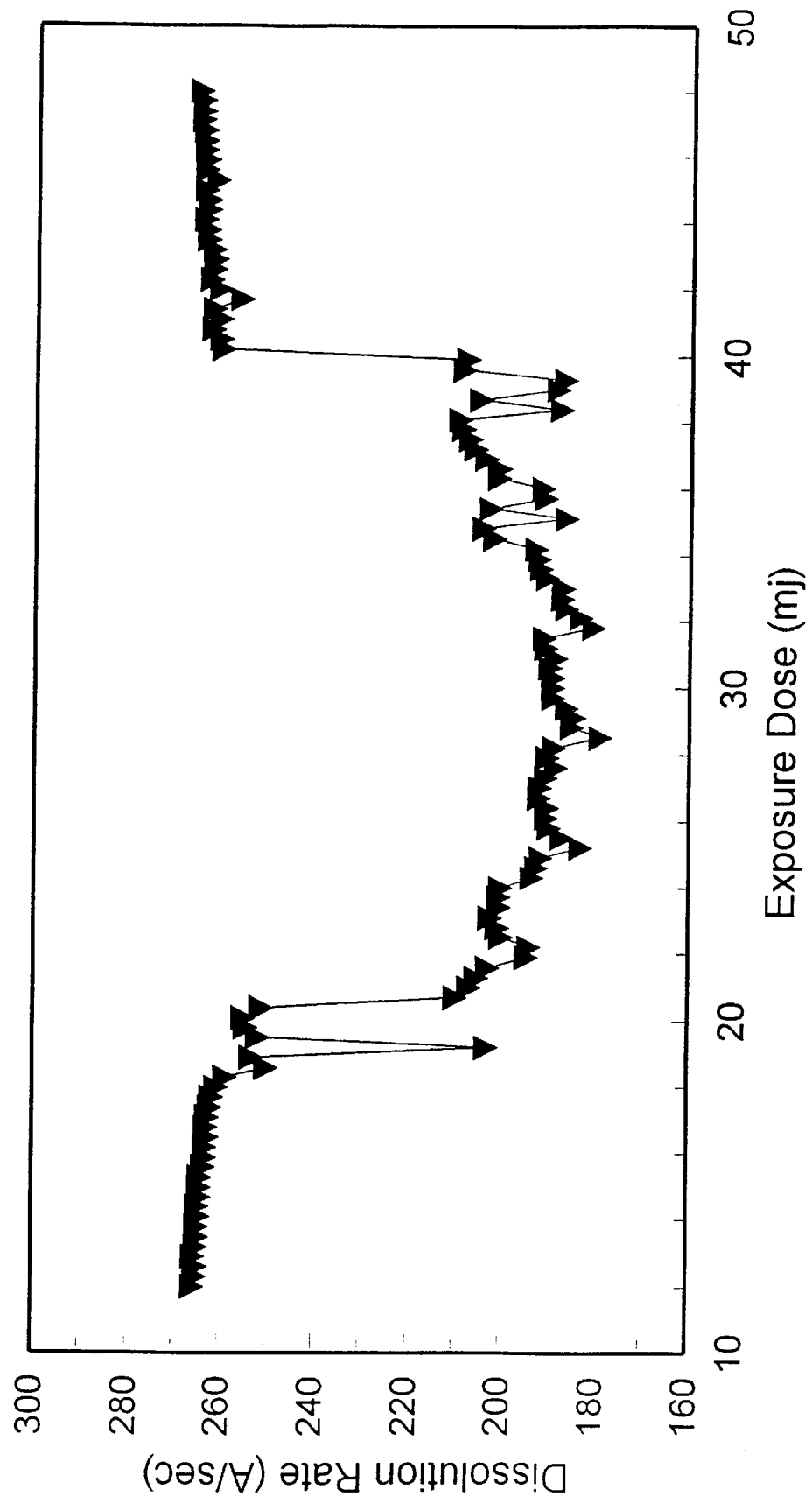

One example of a resist composition that may be used to form wafer portion 1500 combines a PHOST resin with approximately 1% by weight of solids TPS PAG, 2% nitro-carbamate PBG, a cross-linker, and 0.1% TBAH as base additive. The PHOST resin experiences a decrease in solubility through cross-linking when exposed to acid. A photo acid may be activated at about 10 $mJ/cm^2$, while a photo base may be activated at about 110 $mJ/cm^2$. In addition, the TBAH may shift the portion of the dissolution curve caused by the photo acid, narrowing the line produced at the edge of the reticle opening. Thus, image wise exposure of such a resist system creates a line with a smaller width compared to a line created without the base additive. The dissolution rate response curve for this material is shown in FIG. 24. Notably, the dissolution rate increases at less than about 20 $mJ/cm^2$ and greater than about 40 $mJ/cm^2$, but is lower at exposures between 20 and 40 $mJ/cm^2$. Accordingly, the area of intermediate exposure that will produce a hybrid line is smaller than that shown in FIG. 25 for a resist without a base additive.

It is a further advantage over conventional hybrid resists that resist compositions according to preferred embodiments of the present invention may be formulated to achieve higher levels of scaling and new methods of printing. Formulations are conceivable that combine PBGs and PAGs of appropriate types and loadings with either a positive tone or negative tone resin to produce multi-phase hybrid resist formulations. That is, hybrid resist compositions in which more than two solubility transitions may be induced. Such an advantage may be accomplished by providing an additional PAG or PBG beyond the one PAG and one PBG already present in the resist formulation. If a given resist composition prints a space at the edge of an aerial image and a line about the center of the aerial image, then the objective of providing an additional PAG or PBG is to print another space at the center of the aerial image in a portion of the line normally formed about the center. If a given resist composition prints a line at the edge of an aerial image and a space about the center of the aerial image, then the objective of providing an additional PAG or PBG is to print another line at the center of the aerial image in a portion of the space normally formed about the center.

Generally, if the PAG is activated at the low dose and the PBG is activated at the higher dose, then an additional PAG should be provided that is activated at a dose beyond the higher dose. Further, the additional PAG should generally be loaded in the resist composition at an amount that exceeds either the loading of the low dose PAG or higher dose PBG. Similarly, if the PBG is activated at the low dose instead, then an additional PBG should preferably be provided that is activated at a dose beyond the higher dose of the PAG and in an amount that exceeds the loading of either the low dose PBG or higher dose PAG. Of course, it is conceivable that still other resist compositions in keeping with the principles described herein could be formulated to produce multi-phase hybrid resist formulations producing more than two solubility transitions.

Turning again to FIG. 6, a dissolution response curve is shown having two solubility transitions. Dissolution rate at first increases with increasing exposure dose, but then decreases as exposure dose continues to increase. The dissolution response curve of FIG. 6 can thus be said to be a two-phase dissolution curve and have a first solubility transition occurring at a low dose and a second solubility transition occurring at a higher dose. The preferred embodiments of the present invention are capable of producing more than two solubility transitions and can thus be said to exhibit a multi-phase dissolution curve. In one example of a multi-phase dissolution curve, namely a tri-phase dissolution curve, the first solubility transition occurring at a low dose shown in FIG. 6 is essentially repeated after the second solubility transition at a dose beyond the higher dose. Thus, dissolution rate at first increases with increasing exposure dose, then decreases with further increasing exposure dose, and then increases again as exposure dose continues to increase.

For example, if a positive tone resin is used, then a PAG may create acid at low expose doses which induces deprotection and solubilization of the exposed area, causing a first transition in the dissolution rate of the resist. The PBG may create base at higher doses, quenching the photo acid and causing a second transition in the dissolution rate of the resist such that the more highly exposed resist does not dissolve. An additional PAG may then create acid at a dose beyond the higher dose of the PBG to overcome the quenching effect of the PBG, inducing deprotection and solubilization of the most highly exposed area and causing a third transition in the dissolution rate of the resist.

For a negative tone resin, the described tri-phase dissolution response curve would be inverted. That is, dissolution rate would began high and decrease with increasing exposure dose, then increase with further increasing exposure dose, and then decrease again as exposure dose continues to increase. As a less preferred alternative, a PBG could instead create base at the low dose, thus requiring two PBGs and one PAG.

The described complex dissolution curve allows more than two lines or more than two spaces to be created from a single reticle opening in a mask. For example, a space/line/space/line/space can be generated from a single reticle opening in a mask. Alternatively, more than two lines or more than two spaces could be created from a graded gray scale mask, which might not have any specific dark or bright areas. Use of a gray scale mask is described in the related patent application incorporated by reference above and entitled "METHOD FOR FORMING FEATURES USING FREQUENCY DOUBLING HYBRID RESIST AND DEVICE FORMED THEREBY," Ser. No. 08/959,779U.S. Pat. No. 6,007,968. Essentially, the gray scale mask may be fabricated to attenuate actinic radiation to a selected degree in selected regions of the mask. In one type of gray scale mask, a grating pattern of lines and spaces at different pitches filters out part of the light. More lines and fewer spaces in the grating pattern creates more filtration. In another type of gray scale mask, the mask material is partially absorptive and filters out part of the light or certain wavelengths of light. For example, the mask material could be thin chrome or other absorbers, such as molybdenum silicide and others used for attenuated phase shift masks. Accordingly, selected regions of a resist may be exposed to selected doses to produce a desired response. One mask could even produce regions of differing exposure dose to take advantage of the features of the present invention wherein the resist response depends on the exposure dose.

Also, for beam exposure methods, such as e-beam, a shaping or gradation of the expose can be used to create different types of responses in the resist. A low expose dose might trigger only a positive tone response in the resist, a moderate dose might trigger a two-phase hybrid response, printing a space/line/space combination, while a high dose expose might print a space/line/space/line/space combination. These spaces and lines could potentially be sub-resolution features, printing the edge of the beam at minimum resolution rather than the entire beam. One way e-beam dose may be altered is by changing the scanning speed. A slow scan speed injects more electrons into the resist, creating a higher expose dose. A fast scan speed injects fewer electrons into the resist, creating a lower expose dose. Accordingly, scan speed may be varied to alter expose dose and trigger the desired solubility response in the resist. Further, some e-beam tools have a shaped beam, in which the width of the beam can be altered with apertures in the tool. A wider aperture can be used to print a wider pattern. Also, some e-beam tools allow the slope of the e-beam edge to be controlled by use of electron optics, such as blurring the edge deliberately, if desired, to create areas of different exposure.

Figure 17:
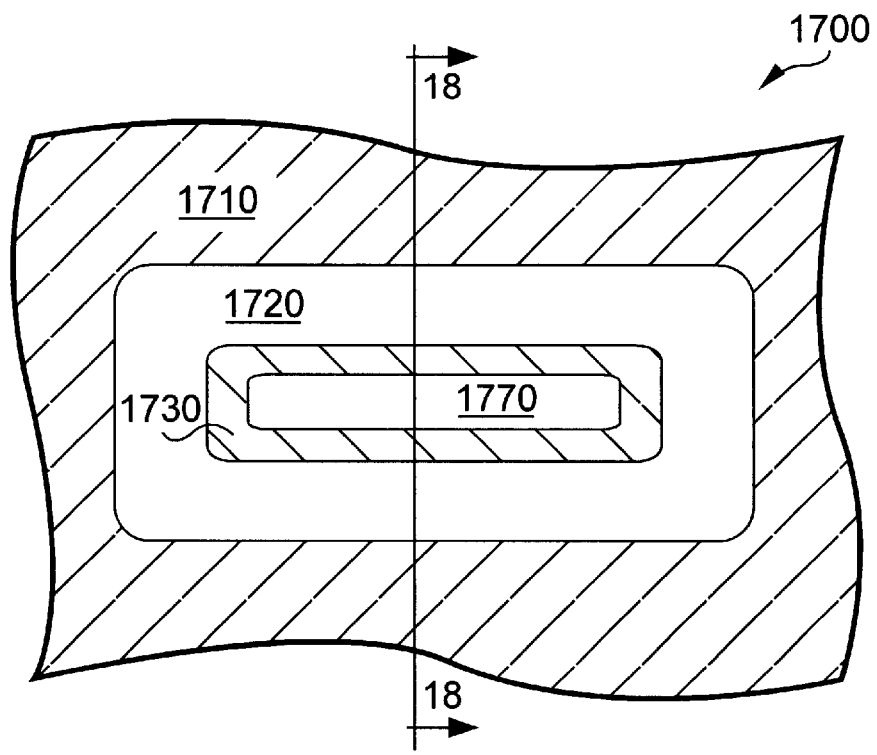
Figure 18:
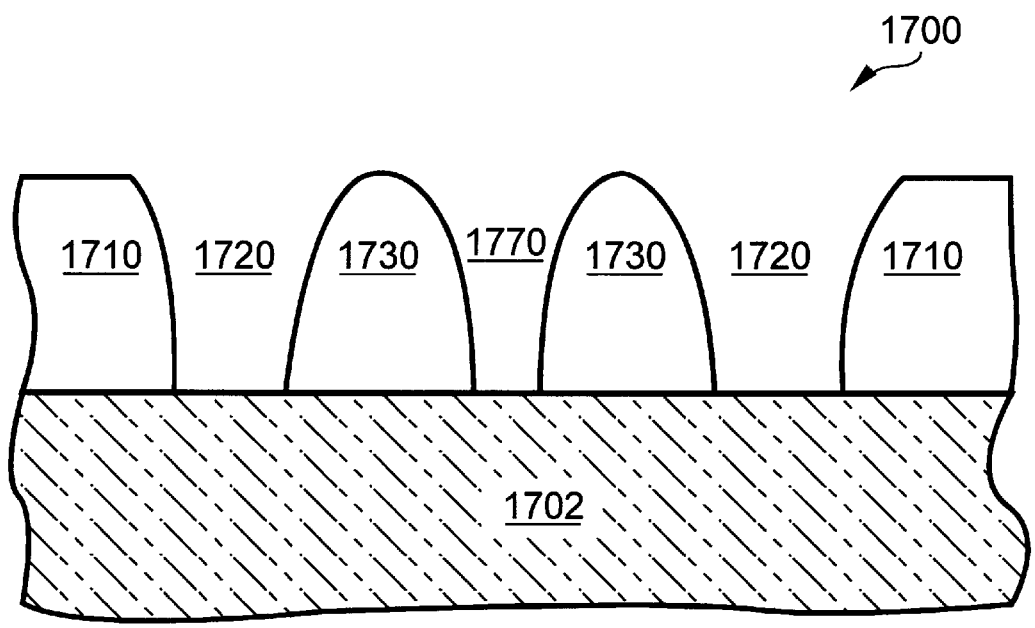

FIGS. 17 and 18 show a wafer portion 1700 having a hybrid resist deposited on substrate 1702, exposed through mask portion 800, and developed. The hybrid resist composition of wafer portion 1700 is one in which the polymer resin exhibits a solubility increase when exposed to acid, a first PAG is activated at low doses to produce acid, the PBG is activated at higher doses to produce base, and a second PAG is activated at the highest doses to produce acid. Using such a hybrid resist, unexposed portions under mask blocking shape 810 remain photo active and insoluble in developer, forming a positive tone line 1710. Intermediate exposed portions of the hybrid resist under the edges of reticle opening 820 become soluble in developer solution after the first exposure and are dissolved during development to form a space 1720 in the hybrid resist. The more highly exposed portions of the hybrid resist closer to the center of the aerial image formed by reticle opening 820 remain photo active since the second PAG is not activated, but also remain insoluble in developer and form a line 1730. In the portion of the hybrid resist forming line 1730, the low dose PAG was activated as was the PBG, thus the photo base quenched the low dose photo acid and solubility of the polymer resin was unchanged. The most highly exposed portion of the hybrid resist at the center of the aerial image becomes soluble in developer solution and is dissolved during development to form a space 1770 in the hybrid resist. In the portion of the hybrid resist forming space 1770, the low dose PAG was activated as was the PBG and the high dose PAG. Thus, the photo base quenched the low dose photo acid and the high dose photo acid overcame the quenching effect, yielding a change in solubility of the polymer resin.

One example of a resist composition that may be used to form wafer portion numeral 1700 combines a PHOST MOCH resin with an active PAG, that is, one that responds to small amounts of actinic energy, for example, about 3 to 30 mJ/cm$^2$, such as tBIC or TPS in low loading, such as approximately 1% by weight of solids. Additionally included are approximately 2% by weight of an active PBG, such as dinitrocyclohexyl carbamate (DNC), and approximately 3% by weight of a low sensitivity (or relatively inactive) PAG requiring the highest exposure dose, such as arylsulfonate. The PHOST MOCH resin experiences an increase in solubility through cleaving of methoxycyclohexene side chains in a deprotection reaction when exposed to acid. The areas of intermediate exposure level at the edges of the aerial image will produce acid as will the most highly exposed area at the center of the aerial image. Accordingly, a space/line/space/line/space resist image may be provided.

Figure 19:
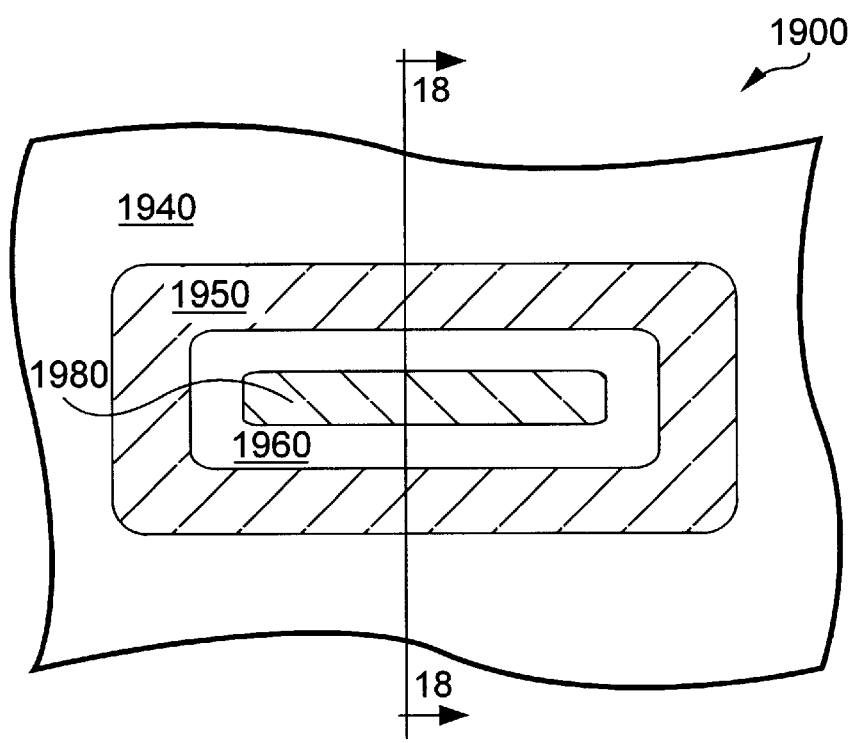
Figure 20:
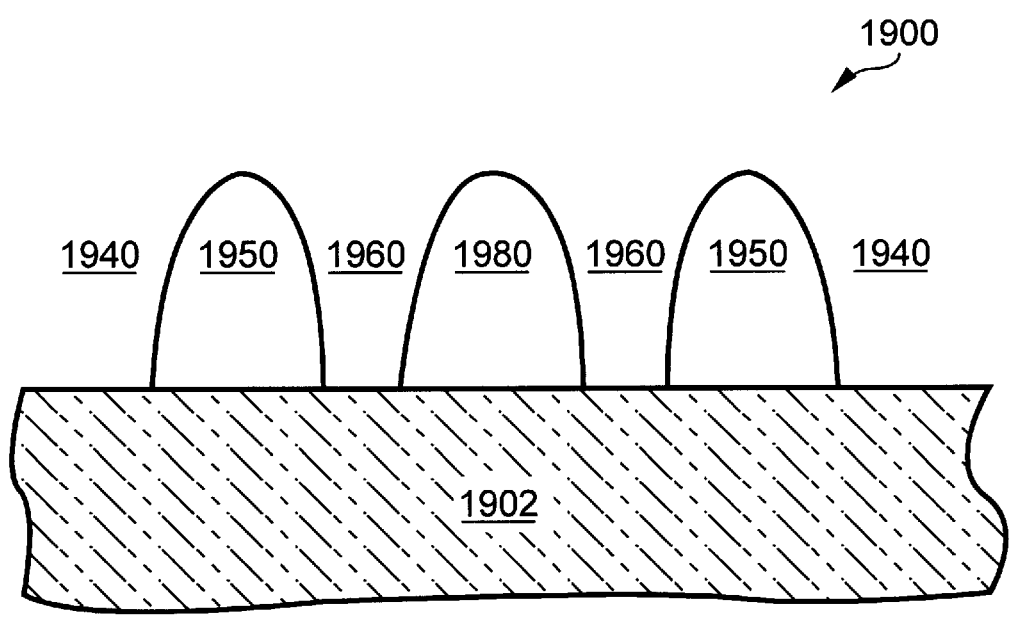

Turning to FIGS. 19 and 20, a wafer portion 1900 is shown having a hybrid resist deposited on a substrate 1902, exposed through a mask portion 800, and developed. The hybrid resist composition of wafer portion 1900 is one in which the polymer resin experiences a solubility decrease when exposed to acid, the PAG is activated at low doses to produce acid, the PBG is activated at higher doses to produce base, and a second PAG is activated at the highest doses to produce acid. For wafer portion 1900, unexposed portions under mask blocking shape 810 are initially soluble in developer and form a negative tone space 1940. Intermediate exposed portions of the hybrid resist under the edges of reticle opening 820 remain photo active since the second PAG is not activated, become insoluble in developer solution, and remain after development to form a line 1950. The more highly exposed portions of the hybrid resist closer to the center of the aerial image formed by reticle opening 820 become soluble in developer solution and are removed during development to form a space 1960. In the portion of the hybrid resist forming space 1960, the low dose PAG was activated as was the PBG, thus the photo base quenched the low dose photo acid and solubility of the polymer resin was unchanged. The most highly exposed portion of the hybrid resist at the center of the aerial image becomes photo inactive, becomes insoluble in developer solution, and forms a line 1980. In the portion of the hybrid resist forming line 1980, the low dose PAG was activated as was the PBG and the high dose PAG, thus the photo base quenched the low dose photo acid and the high dose photo acid overcame the quenching effect, yielding a change in solubility of the polymer resin. Notably, the ability of a photo resist composition according to the preferred embodiments to achieve higher levels of scaling and enable multi-phase resist response is a substantial improvement over conventional hybrid resists which are more limited in the level of scaling and only enable a two-phase resist response.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A photo resist composition comprising:
   a polymer resin;
   a first photo catalyst generator requiring a first dose of actinic energy to generate a first catalyst capable of inducing a solubility change in the polymer resin; and
   a photo quenching agent generator requiring a second dose of actinic energy greater than the first dose to generate a quenching agent, wherein, as the result of a single exposure to actinic energy, the first catalyst is capable of inducing a solubility change in areas of the photo resist exposed to the first dose while the quenching agent is capable of preventing a solubility change in areas of the photo resist exposed to the second dose, thus, causing the photo resist to exhibit a dissolution curve having a plurality of phases when subjected to a single exposure.

2. The photo resist composition of claim 1, wherein the molar amount of the photo quenching agent generator in the composition is greater than the molar amount of the first photo catalyst generator in the composition.

3. The photo resist composition of claim 1, wherein the difference between the first dose and the second dose comprises greater than about 3 millijoules per square centimeter.

4. The photo resist composition of claim 3, wherein the difference between the first dose and the second dose comprises greater than about 30 millijoules per square centimeter.

5. The photo resist composition of claim 1, further comprising a quenching agent additive.

6. The photo resist composition of claim 5, wherein the quenching agent additive is present in an amount sufficient to shift a first solubility transition of the dissolution curve caused by the first catalyst toward a second solubility transition of the dissolution curve caused by the photo generated quenching agent.

7. The photo resist composition of claim 1, further comprising a second photo catalyst generator requiring a third dose of actinic energy, greater than the second dose, to generate a second catalyst capable of inducing a solubility change in the polymer resin by overcoming the quenching agent.

8. The photo resist composition of claim 7, wherein the molar amount of the second photo catalyst generator in the composition is greater than the molar amount of either the first photo catalyst generator or the photo quenching agent generator.

9. The photo resist composition of claim 1, wherein the first catalyst comprises an acid.

10. The photo resist composition of claim 1, wherein the quenching agent comprises a base.

11. A photo resist composition comprising:
    a polymer resin;
    a first photo acid generator requiring a first dose of actinic energy to generate a first photo acid; and
    a photo base generator requiring a second dose of actinic energy different from the first dose to generate a photo base, wherein the photo resist is adapted to produce a hybrid resist image including at least one line and at least one space within an exposed region of the photo resist as the result of a single exposure to actinic energy.

12. The photo resist composition of claim 11, wherein the second dose is greater than the first dose.

13. The photo resist composition of claim 11, wherein the difference between the first dose and the second dose comprises greater than about 3 millijoules per square centimeter.

14. The photo resist composition of claim 13, wherein the difference between the first dose and the second dose comprises greater than about 30 millijoules per square centimeter.

15. The photo resist composition of claim 11, wherein the first photo acid generator comprises di(p-t-butylphenyl) iodonium camphorsulfonate or triphenylsulfonium triflate.

16. The photo resist composition of claim 11, wherein the photo base generator comprises nitrocarbamate or dinitrocyclohexyl carbamate.

17. The photo resist composition of claim 11, wherein the molar amount of the photo base generator in the composition is greater than the molar amount of the first photo acid generator in the composition.

18. The photo resist composition of claim 17, wherein the weight percent of the photo base generator comprises approximately double the weight percent of the first photo acid generator.

19. The photo resist composition of claim 11, further comprising a base additive.

20. The photo resist composition of claim 19, wherein the base additive is present in an amount sufficient to alter the size of the at least one line or the at least one space in the hybrid resist image.

21. The photo resist composition of claim 19, wherein the amount of base additive present comprises about 0.05 to 0.2% by weight of solids.

22. The photo resist composition of claim 19, wherein the base additive comprises tetrabutyl ammonium hydroxide.

23. The photo resist composition of claim 11, further comprising a second photo acid generator requiring a third dose of actinic energy, different from the first dose and the second dose, to generate a second photo acid.

24. The photo resist composition of claim 23, wherein the third dose is greater than either the first dose or the second dose.

25. The photo resist composition of claim 23, wherein the difference between the third dose and the second dose comprises greater than about 3 millijoules per square centimeter.

26. The photo resist composition of claim 25, wherein the difference between the third dose and the second dose comprises greater than about 30 millijoules per square centimeter.

27. The photo resist composition of claim 23, wherein the second photo acid generator comprises arylsulfonate.

28. The photo resist composition of claim 23, wherein the molar amount of the second photo acid generator in the composition is greater than the molar amount of either the first photo acid or the photo base.

29. The photo resist composition of claim 28, wherein the weight percent amount of the second photo acid generator comprises approximately three times the weight percent amount of the first photo acid generator.

* * * * *